US009960180B1

(12) United States Patent
Zhou et al.

(10) Patent No.: US 9,960,180 B1
(45) Date of Patent: May 1, 2018

(54) THREE-DIMENSIONAL MEMORY DEVICE WITH PARTIALLY DISCRETE CHARGE STORAGE REGIONS AND METHOD OF MAKING THEREOF

(71) Applicant: SANDISK TECHNOLOGIES LLC, Plano, TX (US)

(72) Inventors: Fei Zhou, San Jose, CA (US); Raghuveer Makala, Campbell, CA (US); Rahul Sharangpani, Fremont, CA (US); Keerti Shukla, Milpitas, CA (US); Yanli Zhang, San Jose, CA (US); Peng Zhang, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/470,453

(22) Filed: Mar. 27, 2017

(51) Int. Cl.
*H01L 27/11582* (2017.01)
*H01L 23/522* (2006.01)
(Continued)

(52) U.S. Cl.
CPC .. *H01L 27/11582* (2013.01); *H01L 21/28282* (2013.01); *H01L 21/76898* (2013.01);
(Continued)

(58) Field of Classification Search
CPC ... H01L 27/11551–27/11597; H01L 27/11524; H01L 27/11529;
(Continued)

(56) References Cited

U.S. PATENT DOCUMENTS 5,084,417 A   1/1992  Joshi et al.
5,563,105 A  10/1996  Dobusinsky et al.
(Continued)

FOREIGN PATENT DOCUMENTS

JP      2009-289950 A   12/2009
WO   WO 2002/015277 A2    2/2002
WO   WO 2012/052298 A1    4/2012

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Tucker J Wright
(74) *Attorney, Agent, or Firm* — The Marbury Law Group PLLC

(57) ABSTRACT

Memory openings can be formed through an alternating stack of insulating layers and sacrificial material layers. Memory stack structures including charge storage elements can be formed in the memory openings. Inter-level charge leakage in a three-dimensional memory device including a charge trapping layer can be minimized by employing a thin continuous charge trapping material layer within each memory opening. After removal of the sacrificial material layers and formation of backside recesses, discrete charge trapping material portions can be formed by selective growth of a charge trapping material from physically exposed surfaces of each thin continuous charge trapping material layer. The discrete charge trapping material portions can function as primary charge storage regions, and inter-level charge leakage can be minimized by the small thickness of the thin continuous charge trapping material layer.

12 Claims, 35 Drawing Sheets

(51) Int. Cl.
  *H01L 23/532* (2006.01)
  *H01L 23/528* (2006.01)
  *H01L 29/423* (2006.01)
  *H01L 21/768* (2006.01)
  *H01L 21/28* (2006.01)

(52) U.S. Cl.
  CPC ........ *H01L 23/528* (2013.01); *H01L 23/5226* (2013.01); *H01L 23/5329* (2013.01); *H01L 29/42344* (2013.01)

(58) Field of Classification Search
  CPC ............... H01L 29/42324–29/42336; H01L 29/788–29/7889; H01L 21/28282; H01L 29/4234–29/42352; H01L 29/518; H01L 29/792–29/7926; G11C 2216/06–2216/10
  See application file for complete search history.

(56) References Cited

U.S. PATENT DOCUMENTS

| | | |
|---|---|---|
| 5,807,788 A | 9/1998 | Brodsky et al. |
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,691,442 B2 | 4/2010 | Gandikota et al. |
| 7,745,265 B2 | 6/2010 | Mokhlesi et al. |
| 7,745,312 B2 | 6/2010 | Herner et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 7,906,392 B2 | 3/2011 | Dunton et al. |
| 8,008,710 B2 | 8/2011 | Fukuzumi |
| 8,053,829 B2 | 11/2011 | Kang et al. |
| 8,084,819 B2 | 12/2011 | Kim et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,283,228 B2 | 10/2012 | Alsmeier |
| 8,349,681 B2 | 1/2013 | Alsmeier et al. |
| 8,461,641 B2 | 6/2013 | Alsmeier et al. |
| 8,610,194 B2 | 12/2013 | Aritome |
| 8,658,499 B2 | 2/2014 | Makala et al. |
| 8,735,962 B2 | 5/2014 | Whang et al. |
| 8,767,465 B2 | 7/2014 | Chang et al. |
| 8,823,076 B2 | 9/2014 | Lee et al. |
| 8,853,765 B2 | 10/2014 | Lee et al. |
| 8,884,357 B2 | 11/2014 | Wang et al. |
| 8,928,061 B2 | 1/2015 | Chien et al. |
| 8,981,457 B2 | 3/2015 | Lee et al. |
| 8,987,089 B1 | 3/2015 | Pachamuthu et al. |
| 8,987,119 B2 | 3/2015 | Dunton et al. |
| 9,023,719 B2 | 5/2015 | Pachamuthu et al. |
| 9,159,739 B2 | 10/2015 | Makala et al. |
| 9,230,973 B2 | 1/2016 | Pachamuthu et al. |
| 9,252,151 B2 | 2/2016 | Chien et al. |
| 9,305,932 B2 | 4/2016 | Kanakamedala et al. |
| 9,379,124 B2 | 6/2016 | Sharangpani et al. |
| 9,397,093 B2 | 7/2016 | Makala et al. |
| 9,412,790 B1 | 8/2016 | Clark et al. |
| 9,443,861 B1 | 9/2016 | Pachamuthu et al. |
| 9,449,980 B2 | 9/2016 | Rabkin et al. |
| 9,455,263 B2 | 9/2016 | Zhang et al. |
| 9,496,419 B2 | 11/2016 | Sharangpani et al. |
| 9,589,839 B1 | 3/2017 | Ikawa et al. |
| 2007/0029607 A1 | 2/2007 | Kouznetzov |
| 2007/0210338 A1 | 9/2007 | Orlowski |
| 2007/0252201 A1 | 11/2007 | Kito et al. |
| 2009/0230454 A1 | 9/2009 | Pekny |
| 2009/0230458 A1 | 9/2009 | Ishiduki et al. |
| 2009/0283819 A1 | 11/2009 | Ishikawa et al. |
| 2010/0044778 A1 | 2/2010 | Seol |
| 2010/0059811 A1 | 3/2010 | Sekine et al. |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0163968 A1 | 7/2010 | Kim et al. |
| 2010/0181610 A1 | 7/2010 | Kim et al. |
| 2010/0207194 A1 | 8/2010 | Tanaka et al. |
| 2010/0207195 A1 | 8/2010 | Fukuzumi et al. |
| 2010/0213527 A1 | 8/2010 | Shim et al. |
| 2010/0320528 A1 | 12/2010 | Jeong et al. |
| 2011/0018047 A1 | 1/2011 | Komiya |
| 2011/0076819 A1 | 3/2011 | Kim et al. |
| 2011/0133606 A1 | 6/2011 | Yoshida et al. |
| 2011/0156044 A1 | 6/2011 | Lee et al. |
| 2011/0266606 A1 | 11/2011 | Park et al. |
| 2011/0294290 A1* | 12/2011 | Nakanishi ......... H01L 27/11551 438/666 |
| 2011/0298013 A1 | 12/2011 | Hwang et al. |
| 2011/0309432 A1 | 12/2011 | Ishihara et al. |
| 2012/0001247 A1 | 1/2012 | Alsmeier |
| 2012/0001249 A1 | 1/2012 | Alsmeier |
| 2012/0012921 A1 | 1/2012 | Liu |
| 2012/0083077 A1 | 4/2012 | Yang et al. |
| 2012/0142180 A1 | 6/2012 | Matsushita et al. |
| 2012/0256247 A1 | 10/2012 | Alsmeier |
| 2012/0267699 A1 | 10/2012 | Kiyotoshi |
| 2012/0326221 A1 | 12/2012 | Sinha |
| 2013/0161726 A1 | 6/2013 | Kim et al. |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0080309 A1 | 3/2014 | Park et al. |
| 2014/0131784 A1 | 5/2014 | Davis et al. |
| 2014/0191312 A1 | 7/2014 | Kim et al. |
| 2014/0220750 A1 | 8/2014 | Sohn et al. |
| 2014/0225181 A1 | 8/2014 | Makala et al. |
| 2014/0332873 A1 | 11/2014 | Yoo |
| 2015/0044833 A1 | 2/2015 | Lee et al. |
| 2015/0179662 A1 | 2/2015 | Makala et al. |
| 2015/0076584 A1 | 3/2015 | Pachamuthu et al. |
| 2015/0076585 A1 | 3/2015 | Pachamuthu et al. |
| 2015/0179660 A1 | 6/2015 | Yada et al. |
| 2015/0255481 A1 | 9/2015 | Baenninger et al. |
| 2015/0340274 A1 | 11/2015 | Ryan et al. |
| 2015/0371709 A1 | 12/2015 | Kai et al. |
| 2015/0380419 A1 | 12/2015 | Gunji-Yoneoka et al. |
| 2016/0064532 A1 | 3/2016 | Makala et al. |
| 2016/0071860 A1 | 3/2016 | Kai et al. |
| 2016/0071861 A1 | 3/2016 | Serov et al. |
| 2016/0071876 A1 | 3/2016 | Mizuno et al. |
| 2016/0086972 A1 | 3/2016 | Zhang et al. |
| 2016/0133642 A1 | 5/2016 | Jeon et al. |
| 2016/0148945 A1 | 5/2016 | Sharangpani et al. |
| 2016/0225866 A1 | 8/2016 | Peri et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, "3D Cells Make Terabit NAND Flash Possible," Nikkei Electronics Asia, Sep. 17, 2009, 6pgs.
International Search Report & Written Opinion, PCT/US2011/042566, Jan. 17, 2012.

(56) References Cited

OTHER PUBLICATIONS

Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
Ooshita, Toshiba Announces 32Gb 3D-Stacked Multi-Level NAND Flash, 3 pages, http://techon.nikkeibp.co.ip/english/NEWS EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Kim et al., "Direct Copper Electroless Deposition on a Tungsten Barrier Layer for Ultralarge Scale Integration," J. Electrochem. Soc., vol. 152, Issue 2, pp. C89-C95, (2005).
Au et al., "Filling Narrow Trenches by Iodine-Catalyzed CVD of Copper and Manganese on Managanese Nitride Barrier/Adhesion Layers," J. Electrochem. Soc., vol. 158, Issue 5, pp. D248-D253, (2011).
Williams et al., "Etch Rates for Micromachining Processing," J. Microelectromechanical Systems, vol. 5, No. 4, pp. 256-269, (1996).
Williams et al., "Etch Rates for Micromachining Processing," Part II, J. Microelectromechanical Systems, vol. 12, No. 6, pp. 761-778, (2003).
Claes et al., "Selective Wet Etching of Hf-Based Layers," Abs. 549, 204$^{th}$ Meeting, The Electrochemical Society, Inc., 1 page, (2003).
Non Final Office Action, U.S. Appl. No. 14/468,650, 19 pages, issued Feb. 5, 2016.
Invitation to Pay Additional Fees and Partial International Search Report for PCT/US2015/046035, dated Jan. 22, 2016, 9 pages.
Kang et al., "Improving the Cell Characteristics Using Low-k Gate Spacer in 1Gb NAND Flash Memory," Electron Devices Meeting, IEDM '06 International, IEEE, pp. 1-4, (2006).
International Search Report and Written Opinion for PCT/US2015/046035, dated Mar. 17, 2016, 20 pages.
International Search Report and written Opinion received in connection with international application No. PCT/US2014/045347; dated Oct. 2, 2014.
Non-Final Office Action, U.S. Appl. No. 14/748,670, 21 pages, dated Jul. 15, 2016.
International Search Report and Written Opinion for PCT/US2015/055559, dated Apr. 7, 2016, 19 pages.
Invitation to Pay Additional Fees and Communication Relating to the Results of the Partial International Search for PCT/US2015/055559, 10 pages, dated Jan. 26, 2016.
International Searching Report and Written Opinion of the International Searching Authority for PCT/US2015/042220, 24 pages, dated Jan. 18, 2016.
Non-Final Office Action, U.S. Appl. No. 14/748,575, 20 pages, dated Jul. 15, 2016.
Invitation to Pay Additional Fees and Annex to Form PCT/ISA/206 Communication Relating to Results of the Partial International Search for PCT/US2015/042220, dated Oct. 13, 2015.
Al-Shareef et al., "Gate Dielectrics Formed by Remote Plasma Nitridation of Ultra Thin IN-SITU Steam Generated (ISSG) Oxides," ECS Proc. p. 231, (2009).
Carr et al., "N Depth Profiles in Thin SiO2 Grown of Processed in N2O: The Role of Atomic Oxygen," App. Phys. Lett. vol. 66, No. 12, pp. 1492-1494, (1995).
Hoff et al., "Atomic Oxygen and the Thermal Oxidation of Silicon," Appl. Phys. Lett., vol. 52, No. 15, pp. 1264-1265, (1988).
Ludsteck et al., "Optimization of Thin, Nitrogen-Rich Silicon Oxynitrides Grown by Rapid Thermal Nitridation," Journal of the Electrochemical Society, vol. 152, No. 5, pp. G334-G338, (2005).
Moslehi et al., "Rapid Thermal Nitridation of SiO2 for Nitroxide Thin Dielectrics," Appl. Phys. Lett., vol. 47, No. 10, pp. 1113-1115, (1985).
Sundaresan et al., "Rapid-Thermal Nitridation of SiO2 for Radiation-Hardened MOS Gate Dielectrics," IEEE Transactions on Nuclear Science, vol. NS-33, No. 6, pp. 1223-1227, (1986).
Wrazien et al., "Characterization of Sonos Oxynitride Nonvolatile Semiconductor Memory Devices," Solid-State Electronics, vol. 47, No. 5, pp. 885-891, (2003).
Xu et al., "Effects of Oxgen Content and Oxide Layer Thickness on Interface State Densities for Meta-Oxynitride-Oxide-Silicon Devices," J. App. Phys., No. 70, No. 3, pp. 1570-1574, (1991).
Lin et al., "Work Function Adjustment by Using Dipole Engineering for TaN-Al2O3-Si3N4-HfSiOx-Silicon Nonvolatile Memory," Materials 2015, 8, 5112-5120.
Kennedy et al., "Oxidation of Silicon Nitride Films in an Oxygen Plasma," Journal of Applied Physics, vol. 85, No. 6, pp. 3319-3326, (1999).
Non-Final Office Action, U.S. Appl. No. 15/158,954, dated Nov. 25, 2016, 11 pages.
U.S. Appl. No. 15/049,444, filed Feb. 22, 2016, SanDisk Technologies Inc.
U.S. Appl. No. 15/158,954, filed May 19, 2016, Sandisk Technologies LLC.
U.S. Appl. No. 15/219,652, filed Jul. 26, 2016, Sandisk Technologies LLC.
U.S. Appl. No. 15/219,719, filed Jul. 26, 2016, Sandisk Technologies LLC.
U.S. Appl. No. 15/223,729, dated Jul. 29, 2016, Sandisk Technologies LLC.
U.S. Appl. No. 15/250,185, filed Aug. 29, 2016, Sandisk Technologies LLC.
U.S. Appl. No. 15/361,842, filed Nov. 28, 2016, Sandisk Technologies LLC.

\* cited by examiner

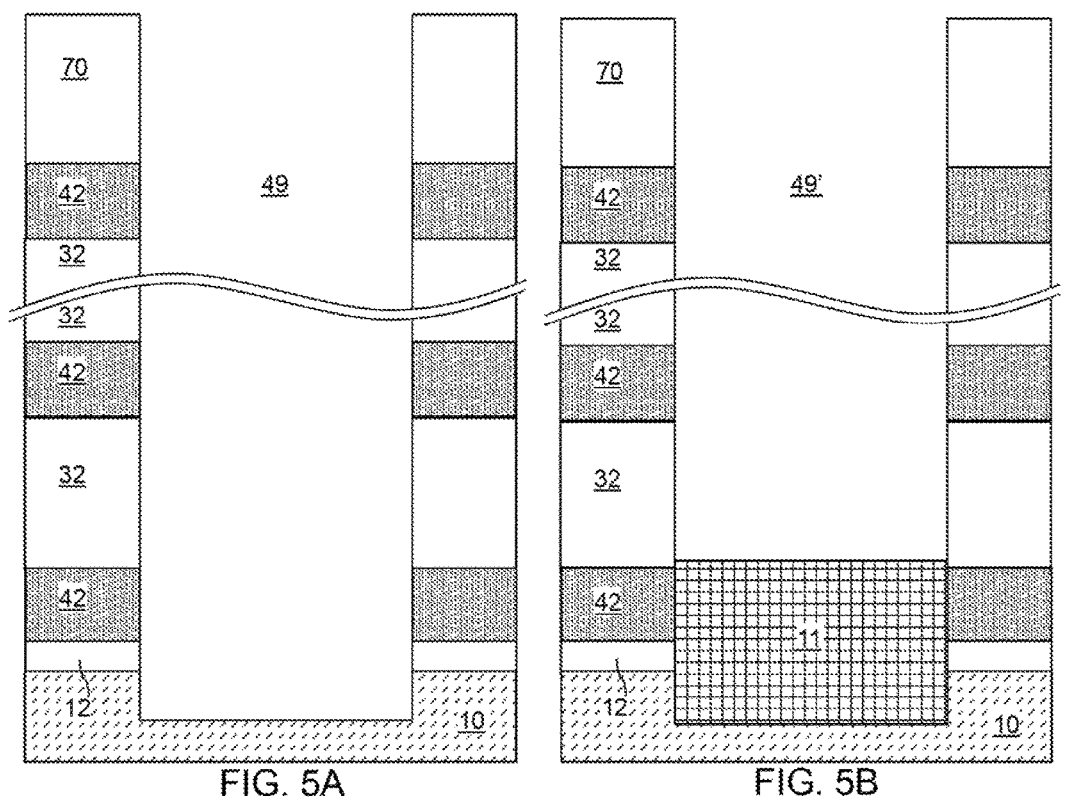

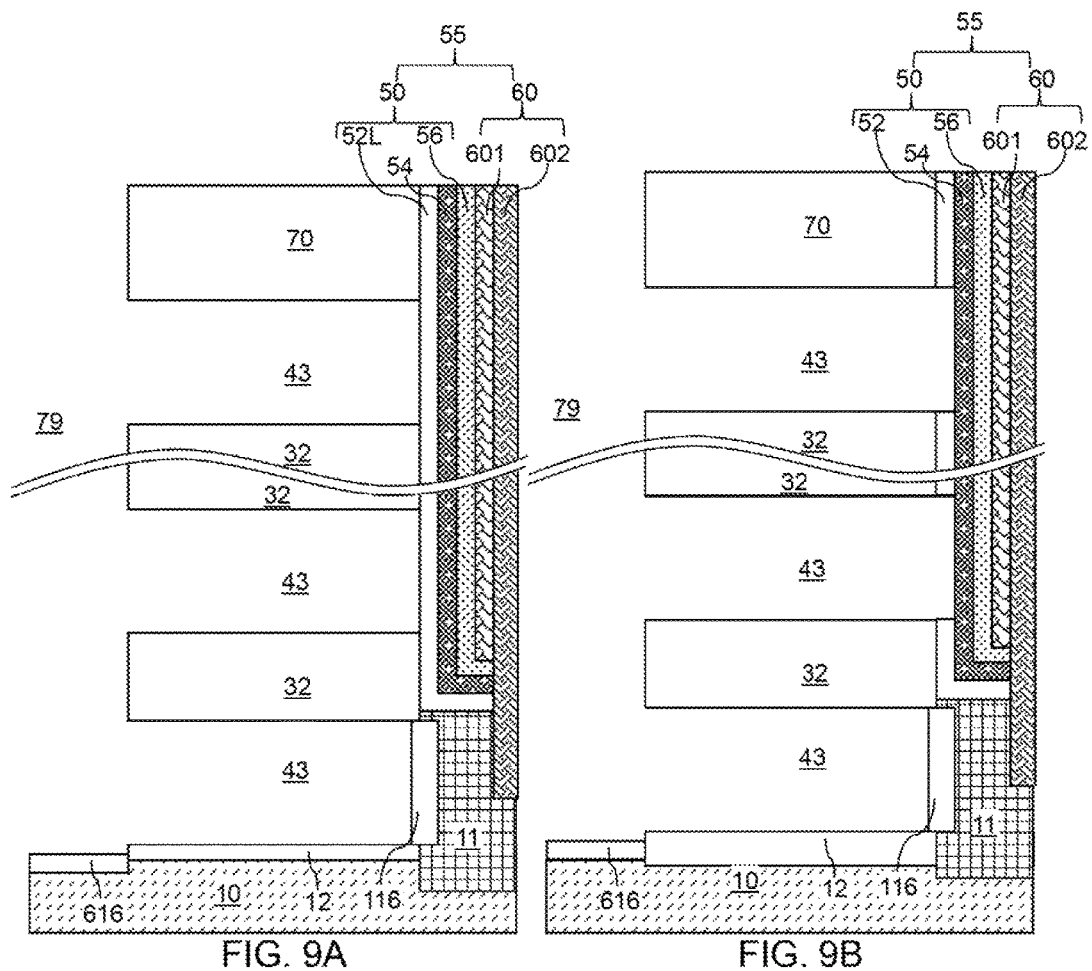

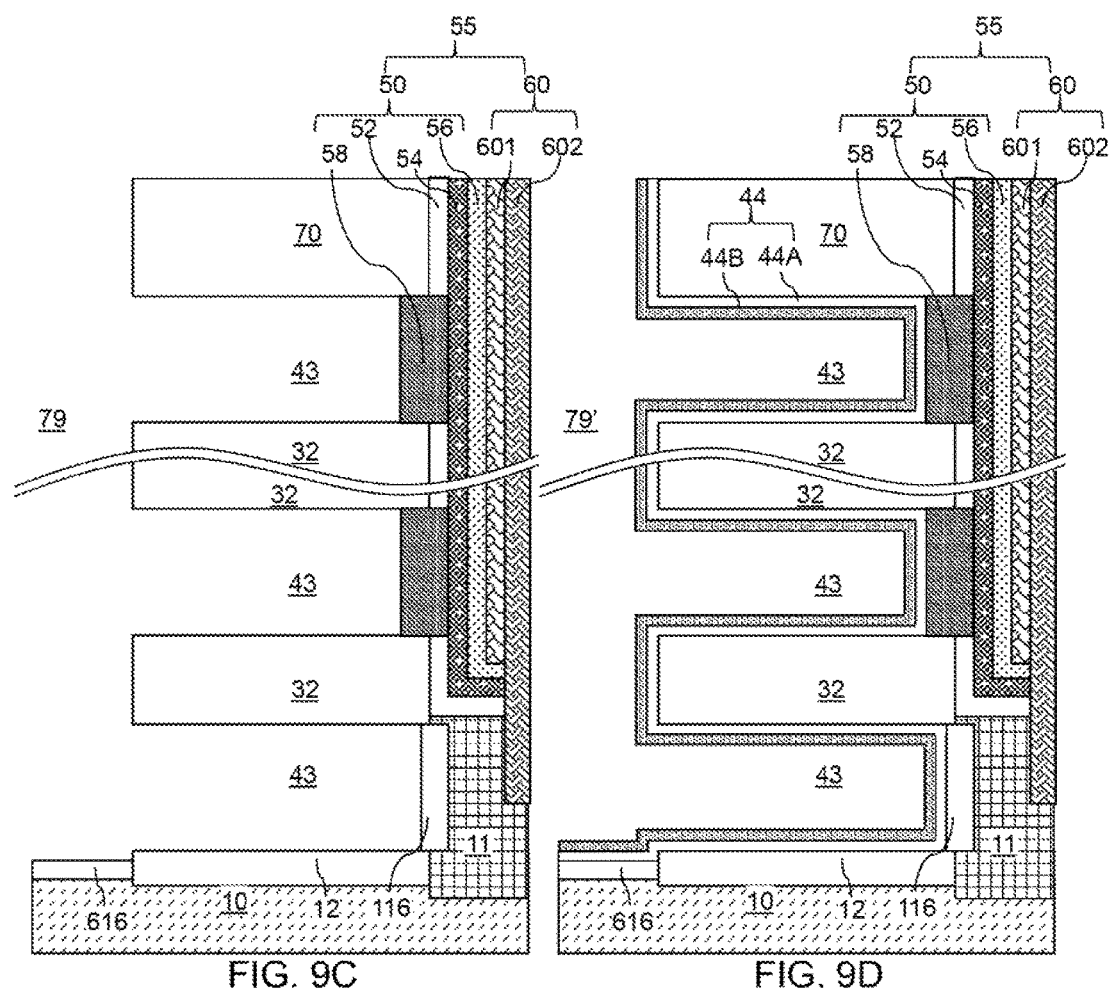

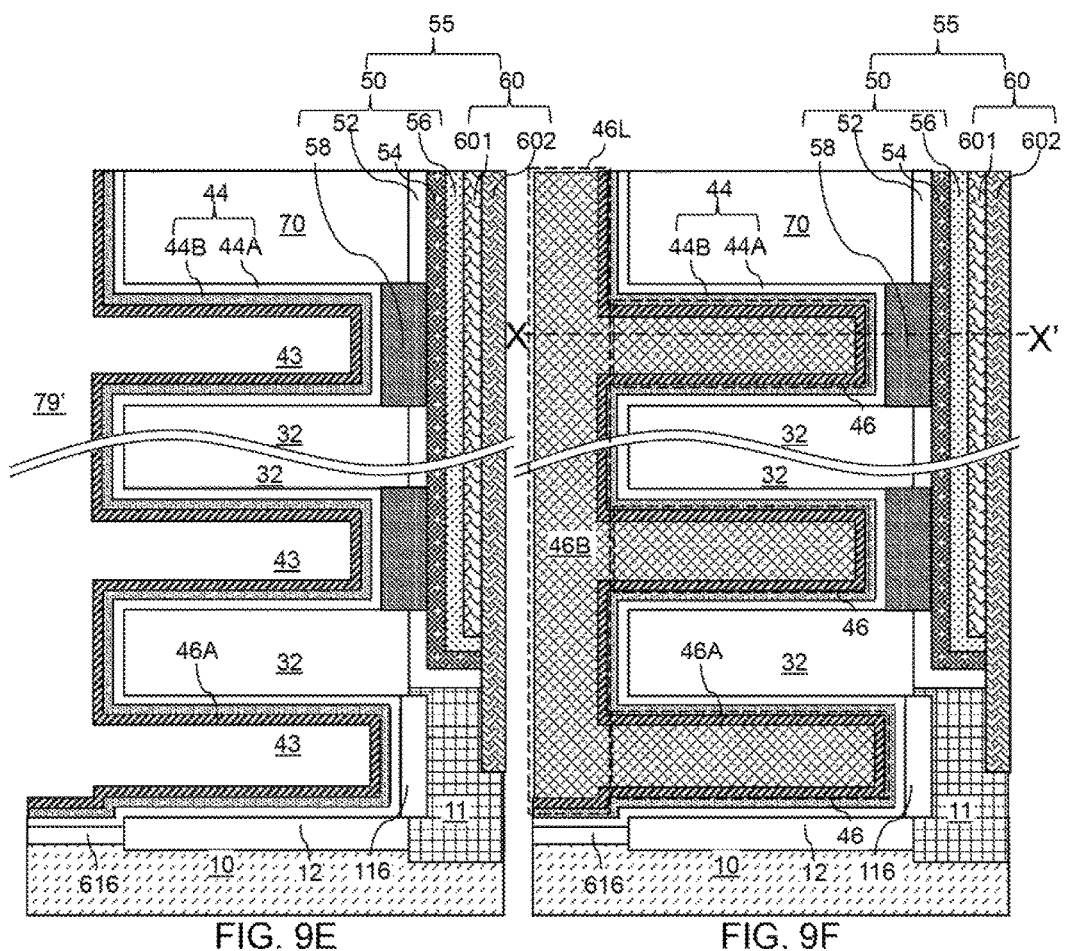

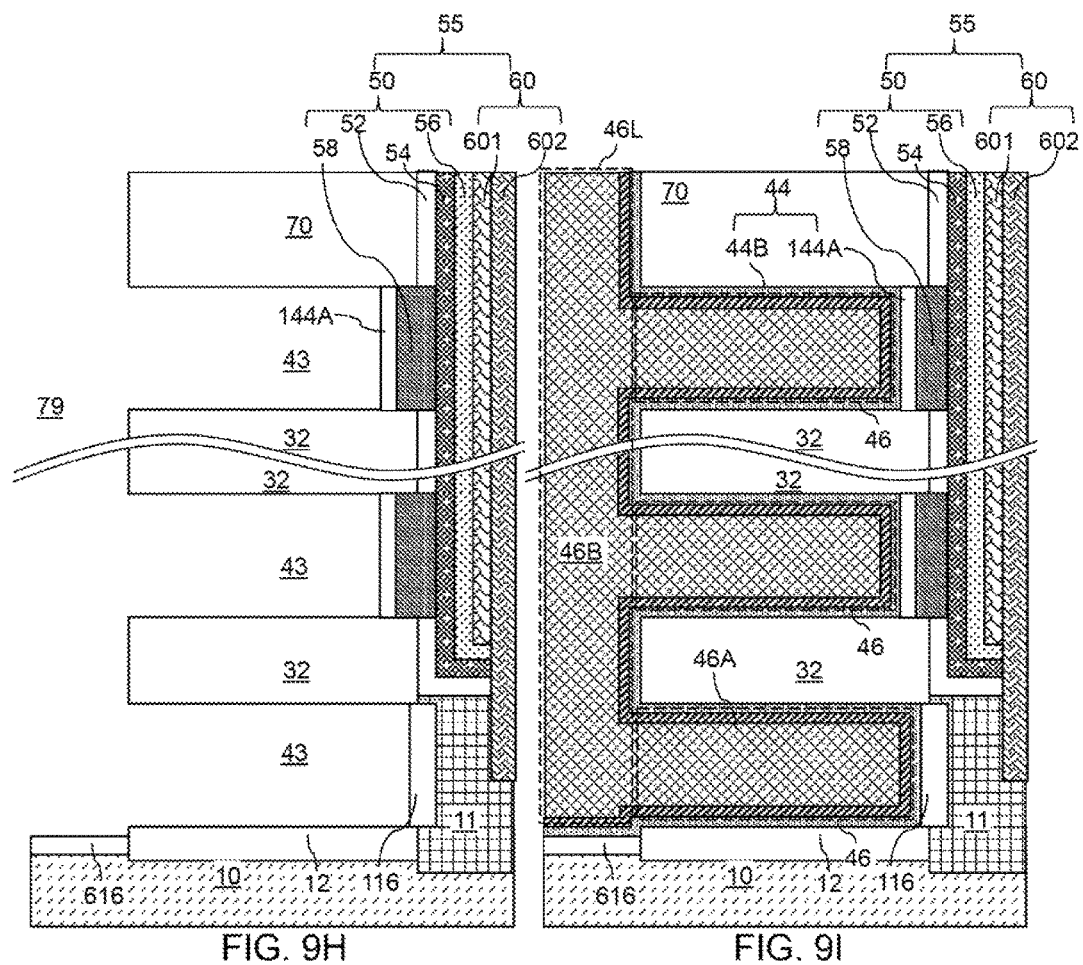

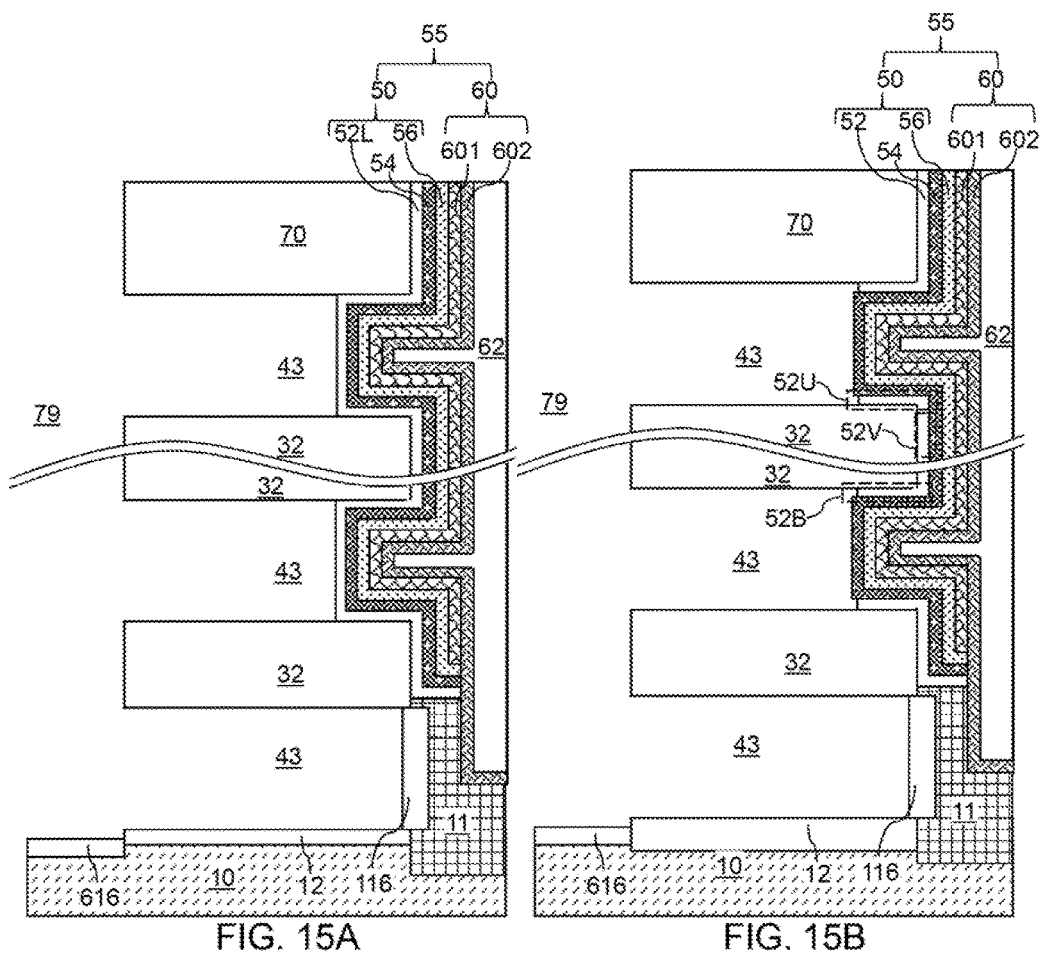

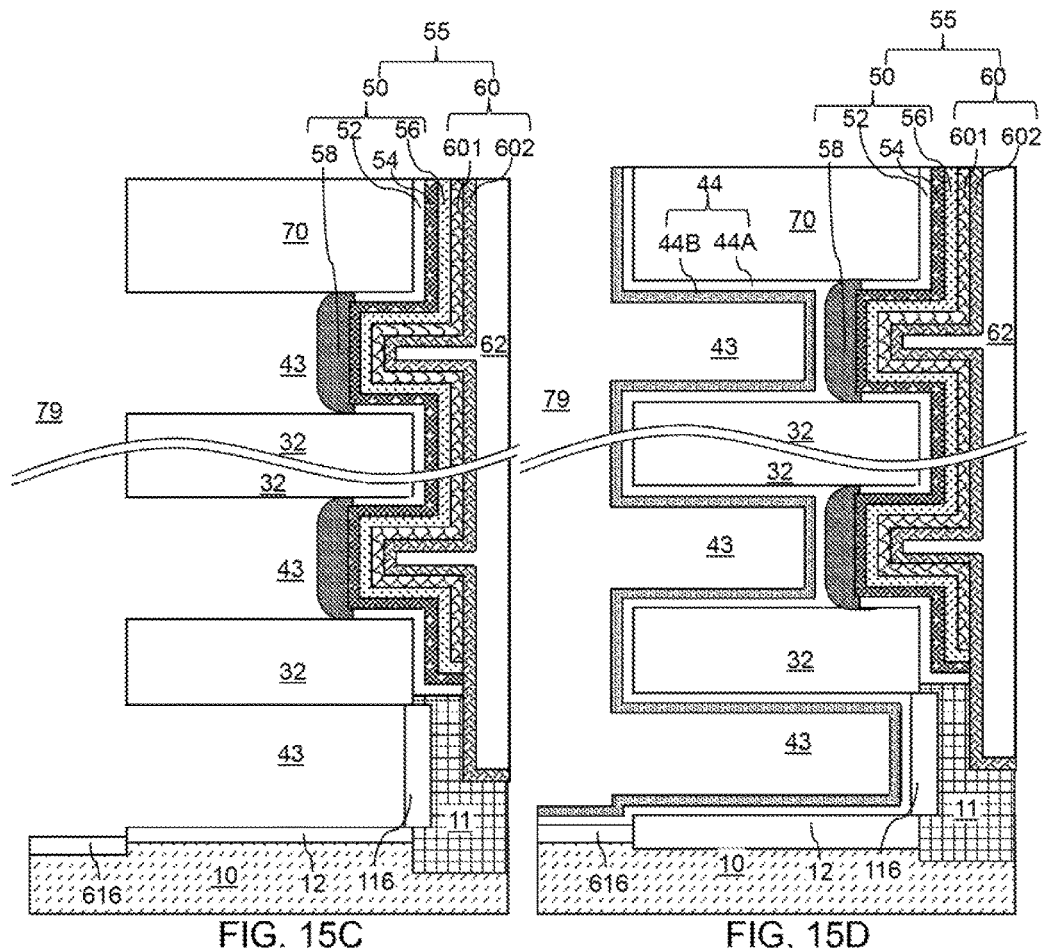

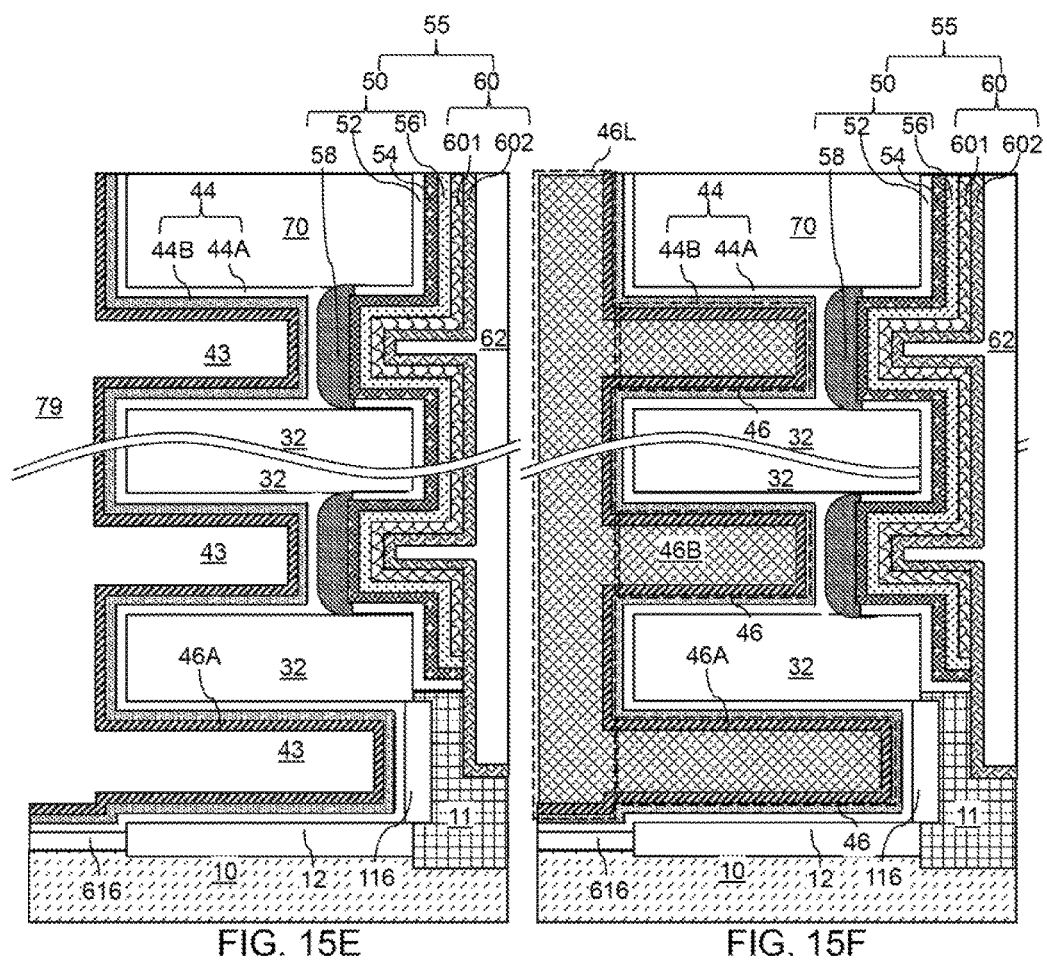

THREE-DIMENSIONAL MEMORY DEVICE WITH PARTIALLY DISCRETE CHARGE STORAGE REGIONS AND METHOD OF MAKING THEREOF

FIELD

The present disclosure relates generally to the field of semiconductor devices, and particular to a three-dimensional memory device including discrete, vertically separated charge storage regions connected by a thin continuous charge storage layer and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel contacting an inner sidewall of the memory film. The memory film comprises: a continuous charge trapping material layer comprising a dielectric first charge trapping material and extending through multiple electrically conductive layers within the alternating stack; and discrete charge trapping material portions comprising a dielectric second charge trapping material and located at levels of the electrically conductive layers, vertically separated from each other, and contacting an outer sidewall of the continuous charge trapping material layer.

According to another aspect of the present disclosure, a method of forming a three-dimensional memory device is provided. An alternating stack of insulating layers and sacrificial material layers is formed over a substrate. A memory opening is formed through the alternating stack. A continuous charge trapping material layer comprising a dielectric first charge trapping material and a vertical semiconductor channel is formed within the memory opening. Backside recesses are formed by removing the sacrificial material layers selective to the insulating layers. Discrete charge trapping material portions comprising a dielectric second charge trapping material are formed by selective deposition of a charge trapping material on physically exposed portions of an outer sidewall of the continuous charge trapping material layer. At least one backside blocking dielectric layer and electrically conductive layers are formed in the backside recesses.

BRIEF DESCRIPTION OF THE DRAWINGS

FIGS. 5A-5H are sequential schematic vertical cross-sectional views of a memory opening within the first exemplary structure during formation of a memory stack structure according to the first embodiment of the present disclosure.

FIGS. 9A-9F are sequential vertical cross-sectional views of a region of the first exemplary structure during formation of electrically conductive layers according to the first embodiment of the present disclosure.

FIGS. 9H-9I are sequential vertical cross-sectional views of a region of an alternative configuration of the first exemplary structure during formation of electrically conductive layers according to the first embodiment of the present disclosure.

FIGS. 15A-15F are sequential vertical cross-sectional views of a region of the second exemplary structure during formation of electrically conductive layers according to the second embodiment of the present disclosure.

DETAILED DESCRIPTION

Figure 1:
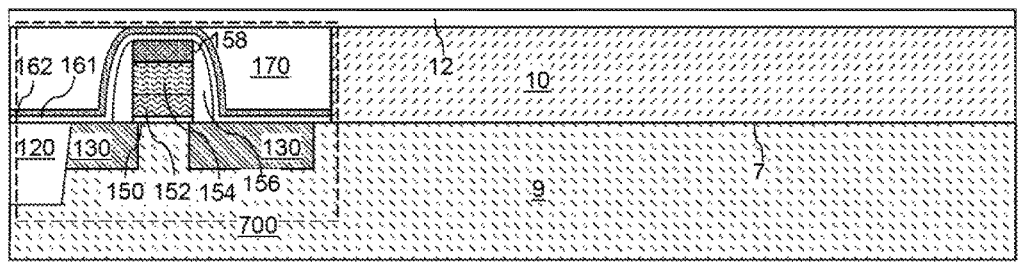
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
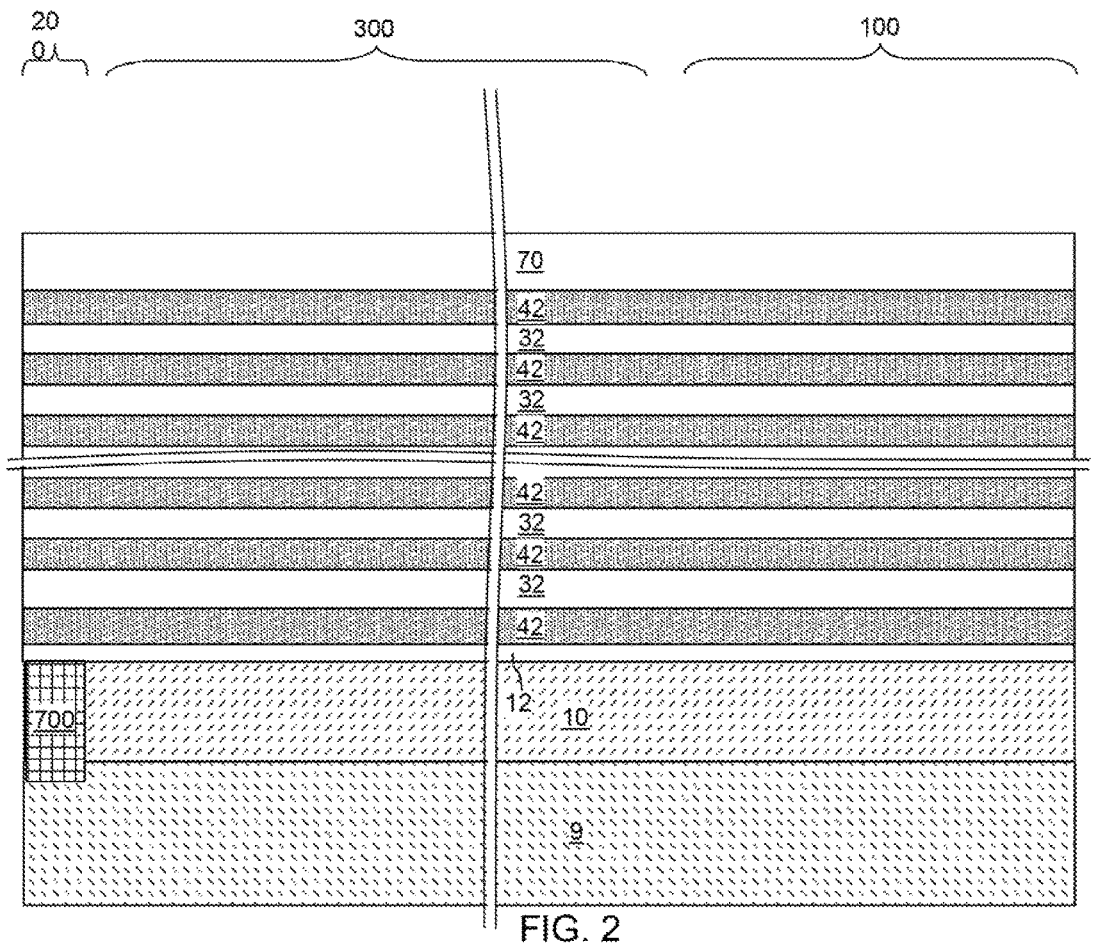
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
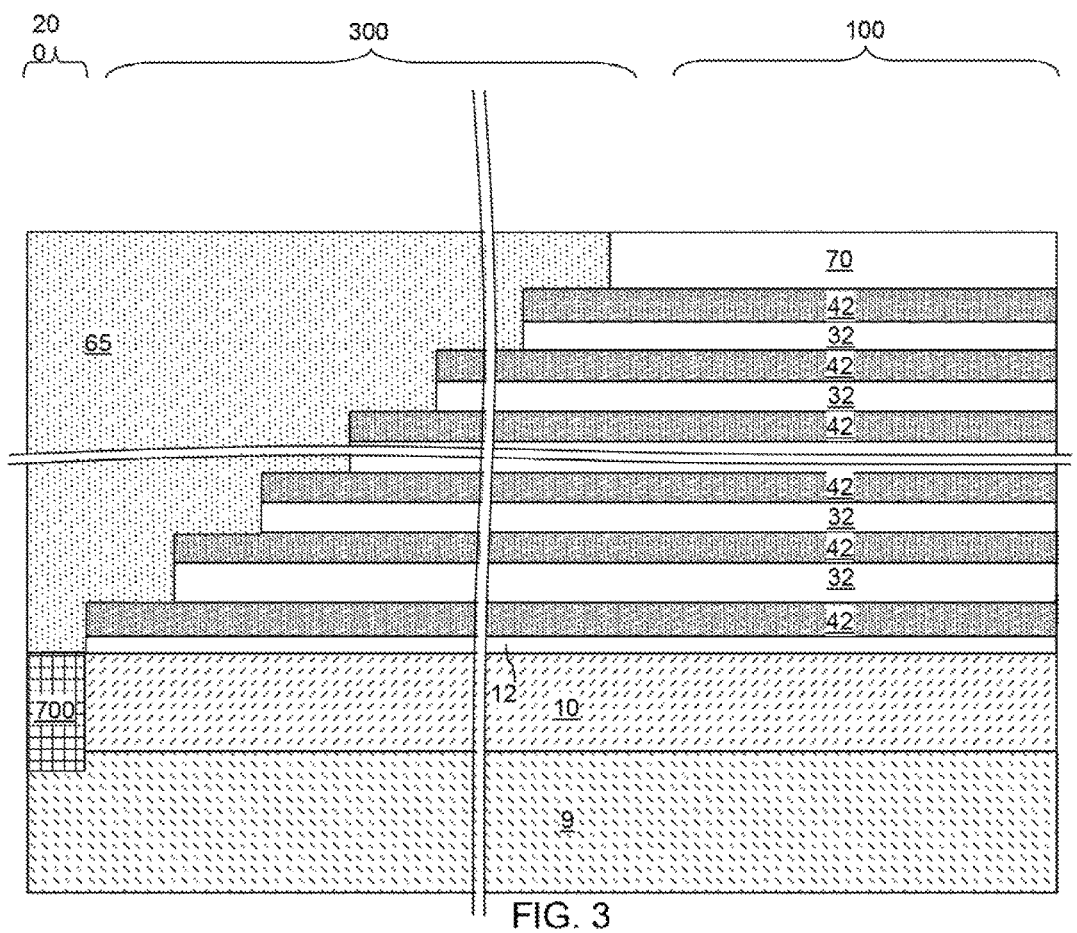
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
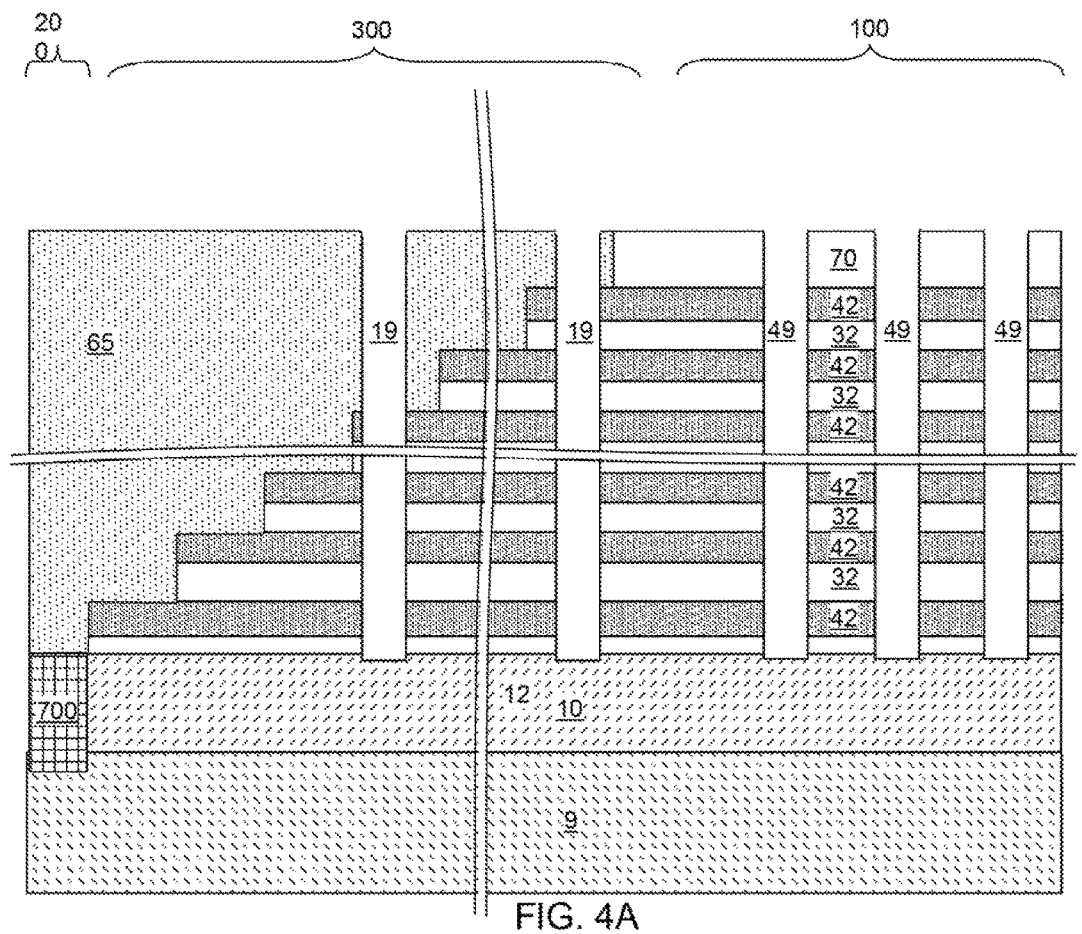
FIG. 4A is a schematic vertical cross-sectional view of the first exemplary structure after formation of memory openings and support openings according to the first embodiment of the present disclosure.
Figure 4B:
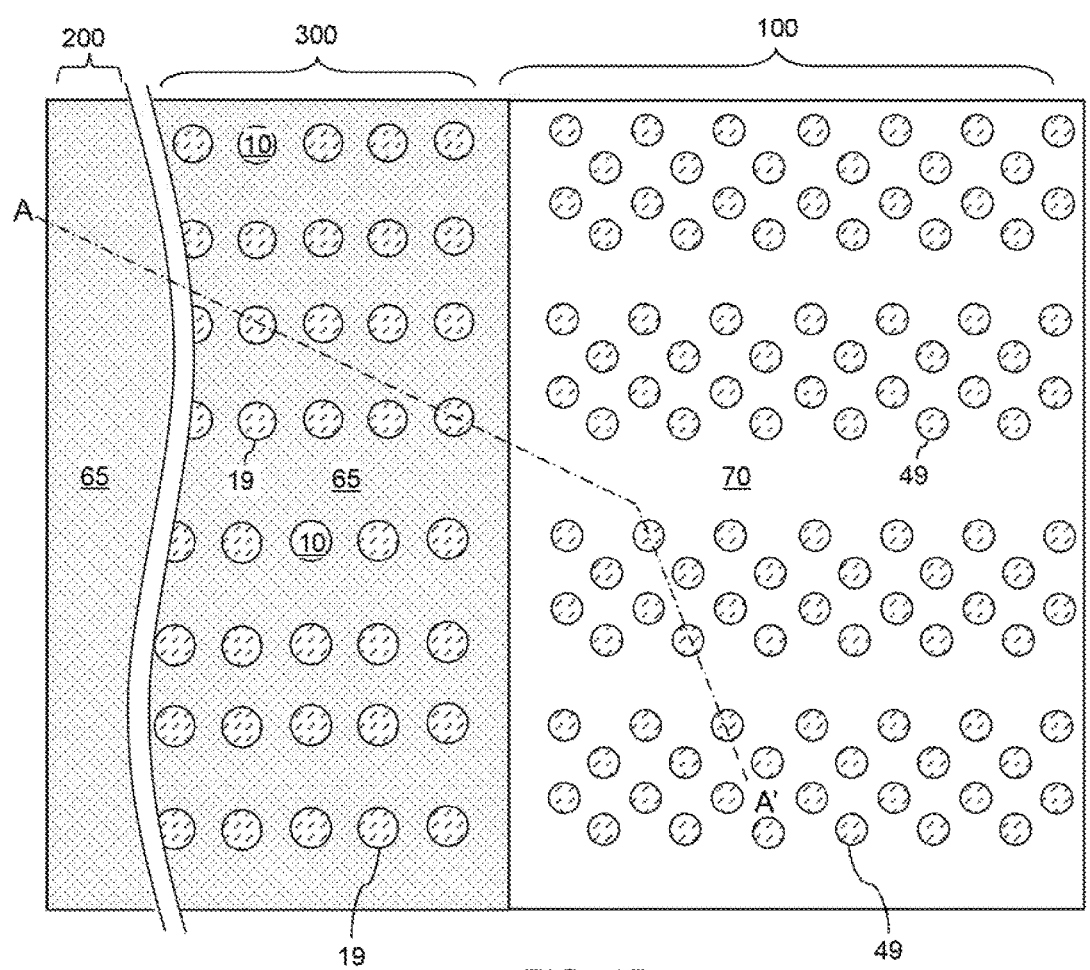
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49 and each support openings 19, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Figure 5C:
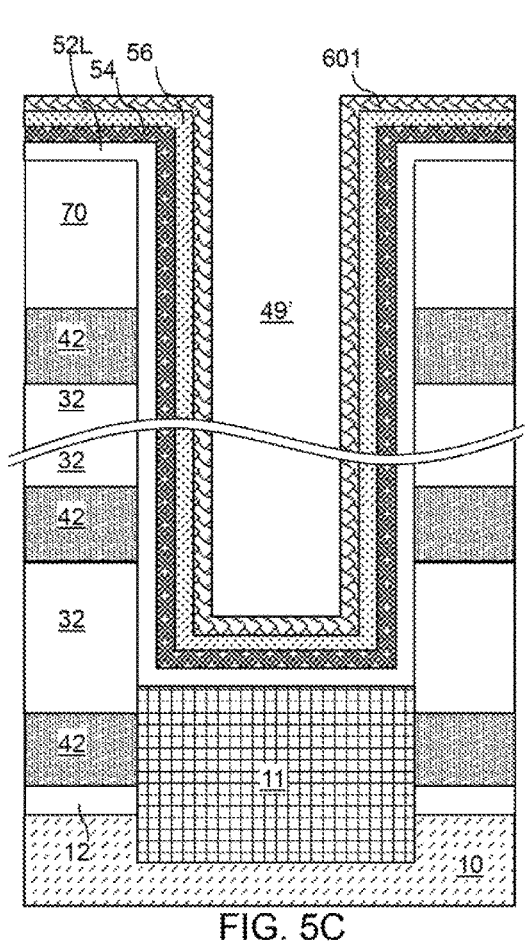

Referring to FIG. 5C, a stack of layers including a continuous silicon oxide layer 52L, a continuous charge trapping material layer 54, a tunneling dielectric layer 56, and an optional first semiconductor channel layer 601 can be sequentially deposited in the memory openings 49.

The continuous silicon oxide layer 52L is a continuous layer of silicon oxide, and can be deposited by a conformal deposition process such as low pressure chemical vapor deposition, atomic layer deposition, or a combination thereof. The thickness of the continuous silicon oxide layer 52L can be in a range from 1 nm to 20 nm, although lesser and greater thicknesses can also be employed. In one embodiment, the entirety of an outer sidewall of the continuous silicon oxide layer 52L can be vertical.

Subsequently, the continuous charge trapping material layer 54 can be formed. The continuous charge trapping material layer includes a dielectric (i.e., electrically insulating) first charge trapping material. In one embodiment, the sacrificial material layers 42 and the insulating layers 32 can have vertically coincident sidewalls, and the continuous charge trapping material layer 54 can be formed as a single continuous charge trapping material layer of homogeneous composition. In one embodiment, the continuous charge trapping material layer 54 includes a first silicon nitride material. The thickness of the continuous charge trapping material layer 54 can be in a range from 1 nm to 10 nm, although lesser and greater thicknesses can also be employed. In one embodiment, the entirety of the outer sidewall of the continuous charge trapping material layer 54 can be vertical.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Figure 5D:
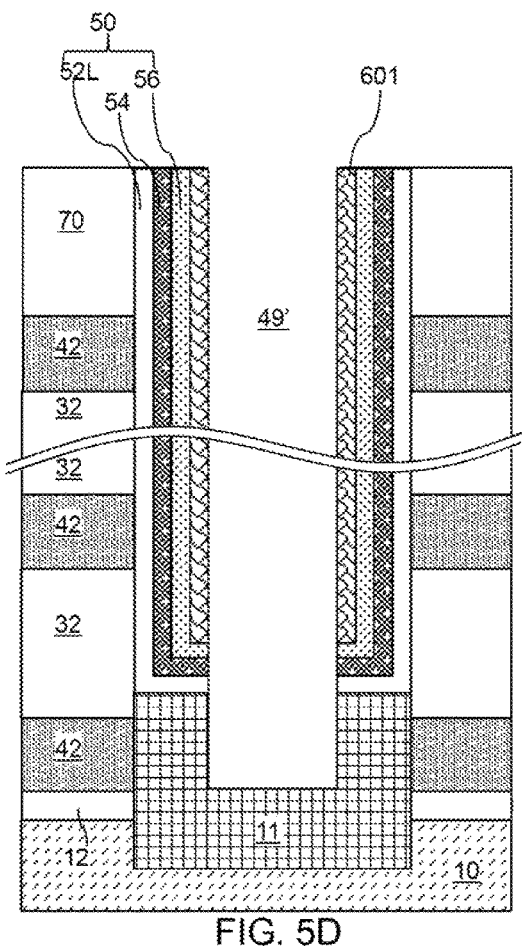

Referring to FIG. 5D, the optional first semiconductor channel layer 601, the tunneling dielectric layer 56, the continuous charge trapping material layer 54, the continuous silicon oxide layer 52L are sequentially anisotropically etched employing at least one anisotropic etch process. The portions of the first semiconductor channel layer 601, the tunneling dielectric layer 56, the continuous charge trapping material layer 54, and the continuous silicon oxide layer 52L located above the top surface of the insulating cap layer 70 can be removed by the at least one anisotropic etch process. Further, the horizontal portions of the first semiconductor channel layer 601, the tunneling dielectric layer 56, the continuous charge trapping material layer 54, and the continuous silicon oxide layer 52L at a bottom of each cavity 49' can be removed to form openings in remaining portions thereof. Each of the first semiconductor channel layer 601, the tunneling dielectric layer 56, the continuous charge trapping material layer 54, and the continuous silicon oxide layer 52L can be etched by a respective anisotropic etch process employing a respective etch chemistry, which may, or may not, be the same for the various material layers.

Each remaining portion of the first semiconductor channel layer 601 can have a tubular configuration. The continuous charge trapping material layer 54 can comprise a charge trapping material or a floating gate material. In one embodiment, each continuous charge trapping material layer 54 can include a vertical stack of charge storage regions that store electrical charges upon programming. In one embodiment, the continuous charge trapping material layer 54 can be a continuous charge trapping material layer in which each portion adjacent to the sacrificial material layers 42 constitutes a charge storage region.

A surface of the epitaxial channel portion 11 (or a surface of the semiconductor material layer 10 in case the epitaxial channel portions 11 are not employed) can be physically exposed underneath the opening through the first semiconductor channel layer 601, the tunneling dielectric layer 56, the continuous charge trapping material layer 54, and the continuous silicon oxide layer 52L. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the continuous charge trapping material layer 54. A set of a continuous silicon oxide layer 52L, a continuous charge trapping material layer 54, and a tunneling dielectric layer 56 in a memory opening 49 constitutes a memory film 50, which includes a plurality of charge storage regions (as embodied as the continuous charge trapping material layer 54) that are insulated from surrounding materials by the continuous silicon oxide layer 52L and the tunneling dielectric layer 56. In one embodiment, the first semiconductor channel layer 601, the tunneling dielectric layer 56, the continuous charge trapping material layer 54, and the continuous silicon oxide layer 52L can have vertically coincident sidewalls.

Figure 5E:
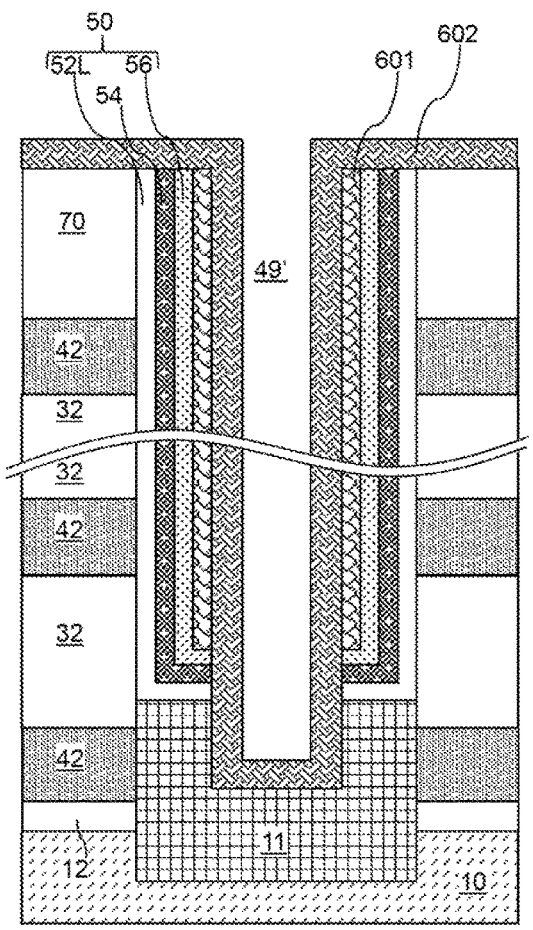

Referring to FIG. 5E, a second semiconductor channel layer 602 can be deposited directly on the semiconductor surface of the epitaxial channel portion 11 or the semiconductor substrate layer 10 if the epitaxial channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
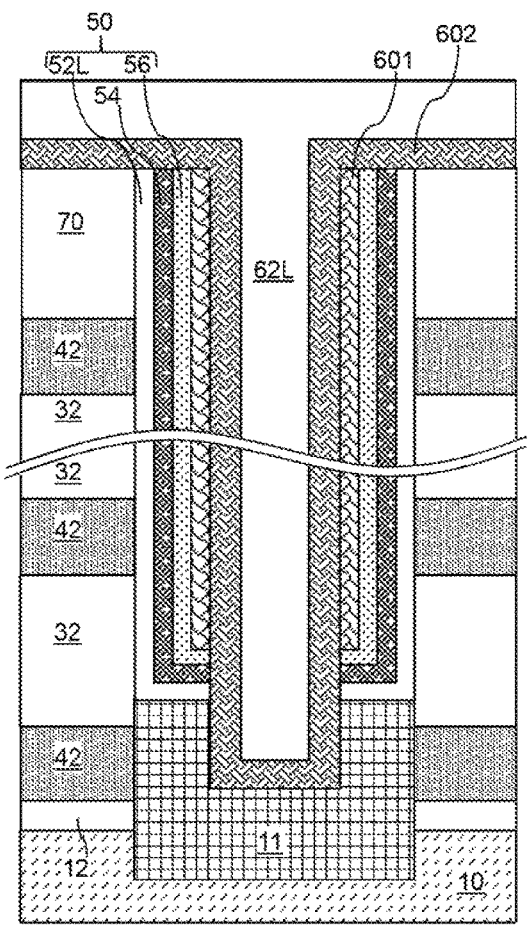

Referring to FIG. 5F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
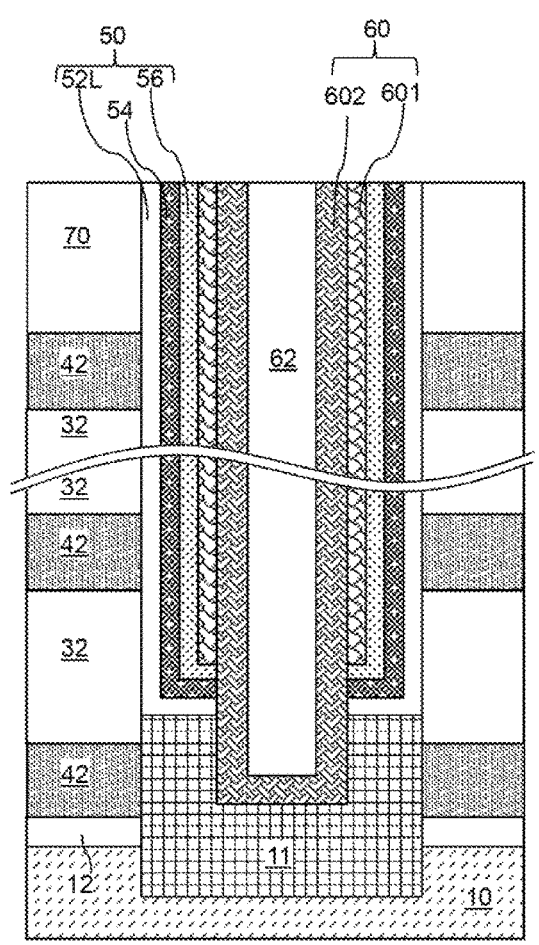

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a continuous charge trapping material layer 54, and laterally surrounds a portion of the vertical semiconductor channel 60. Each adjoining set of a continuous silicon oxide layer 52L, a continuous charge trapping material layer 54, and a tunneling dielectric layer 56 collectively constitute a memory film 50, which can store electrical charges with a macroscopic retention time. In some embodiments, a continuous silicon oxide layer 52L may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
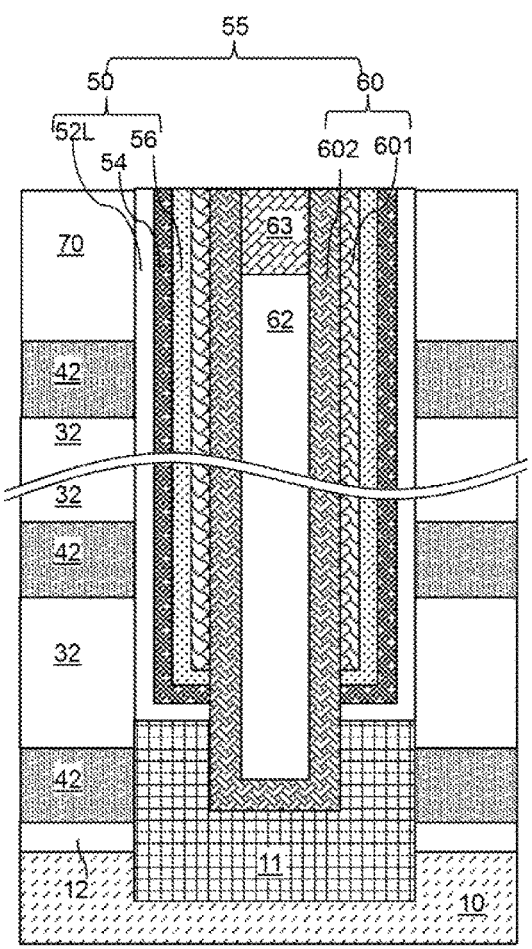

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the continuous charge trapping material layer 54, and an optional continuous silicon oxide layer 52L. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50, a vertical semiconductor channel 60, a dielectric core 62, and a drain region 63 within each support opening 19 fills the respective support openings 19, and constitutes a support pillar structure 20 as shown in FIG. 6.

Figure 6:
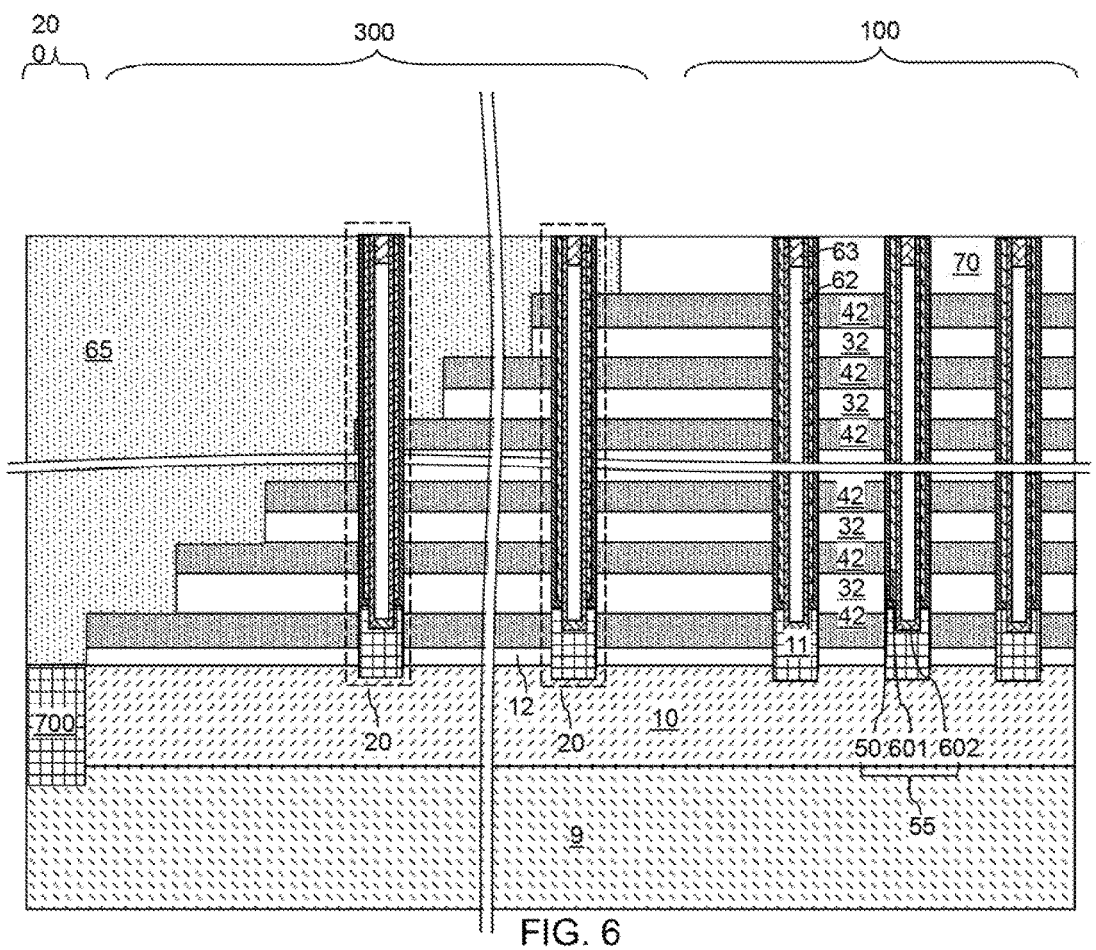
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional continuous silicon oxide layer 52L. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
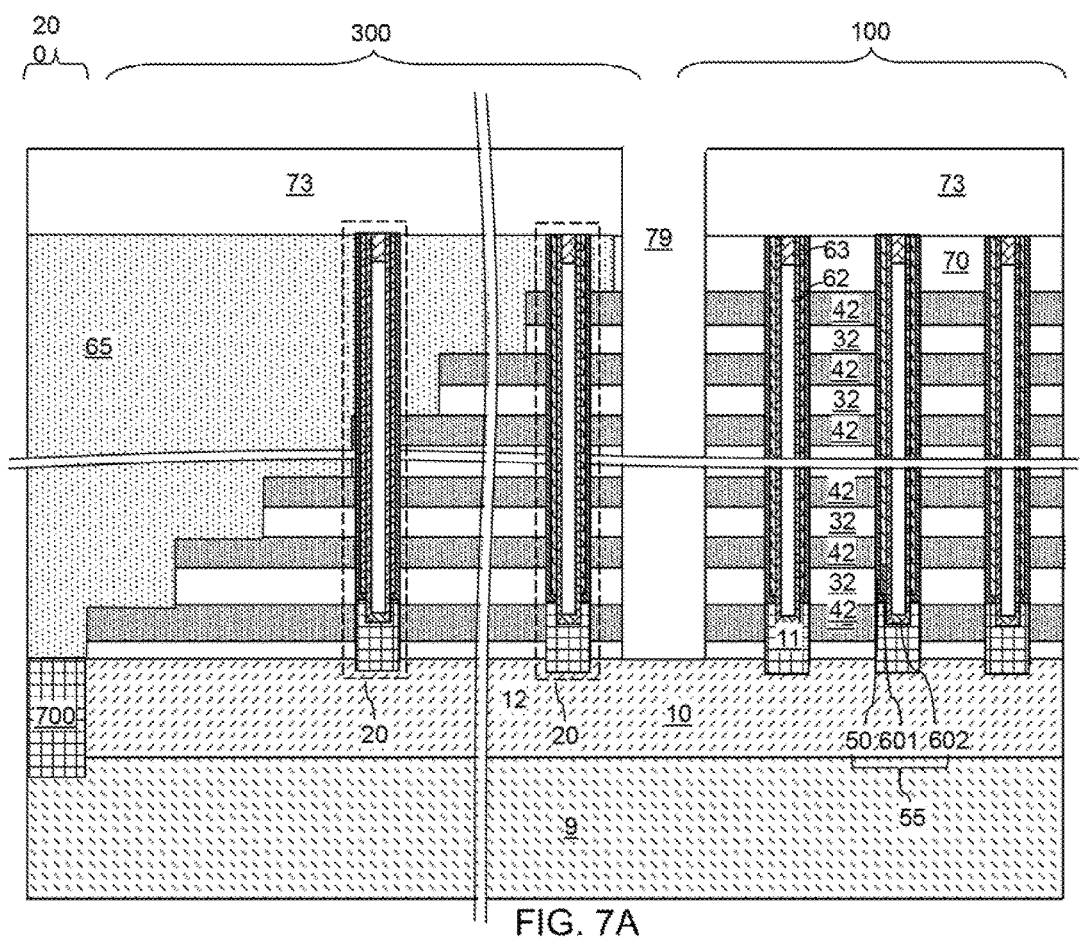
FIG. 7A is a schematic vertical cross-sectional view of the first exemplary structure after formation of a backside trench according to the first embodiment of the present disclosure.
Figure 7B:
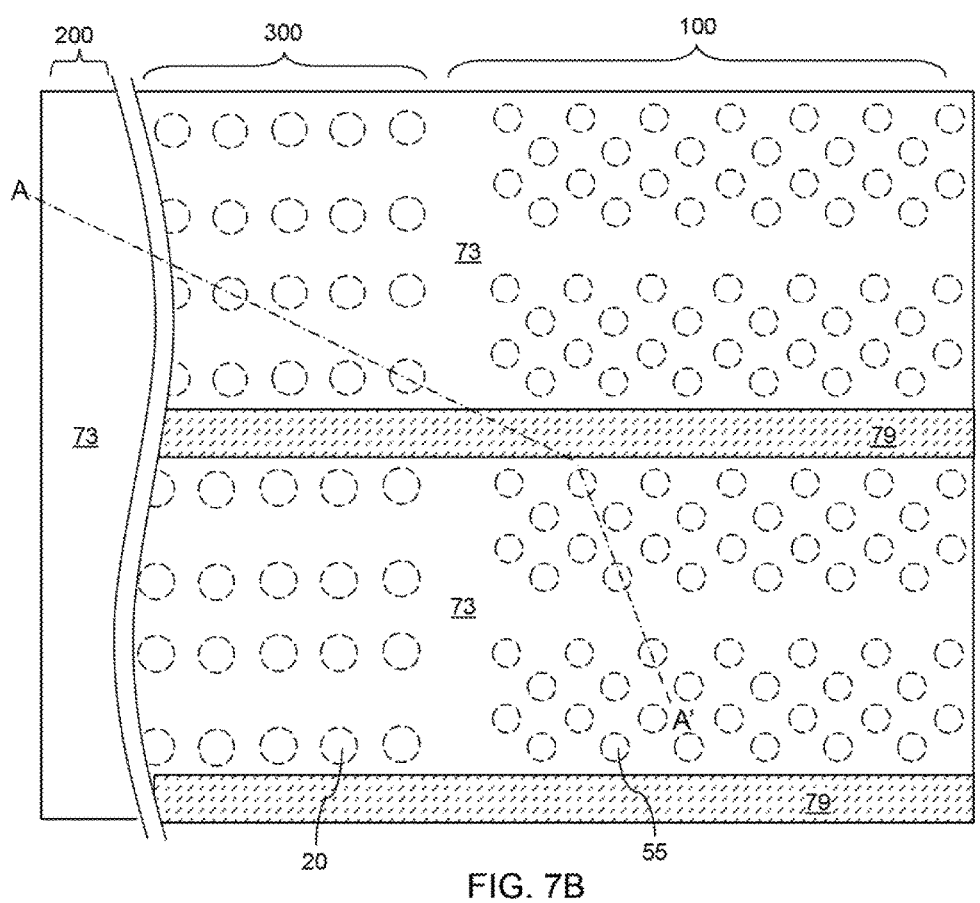
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 8:
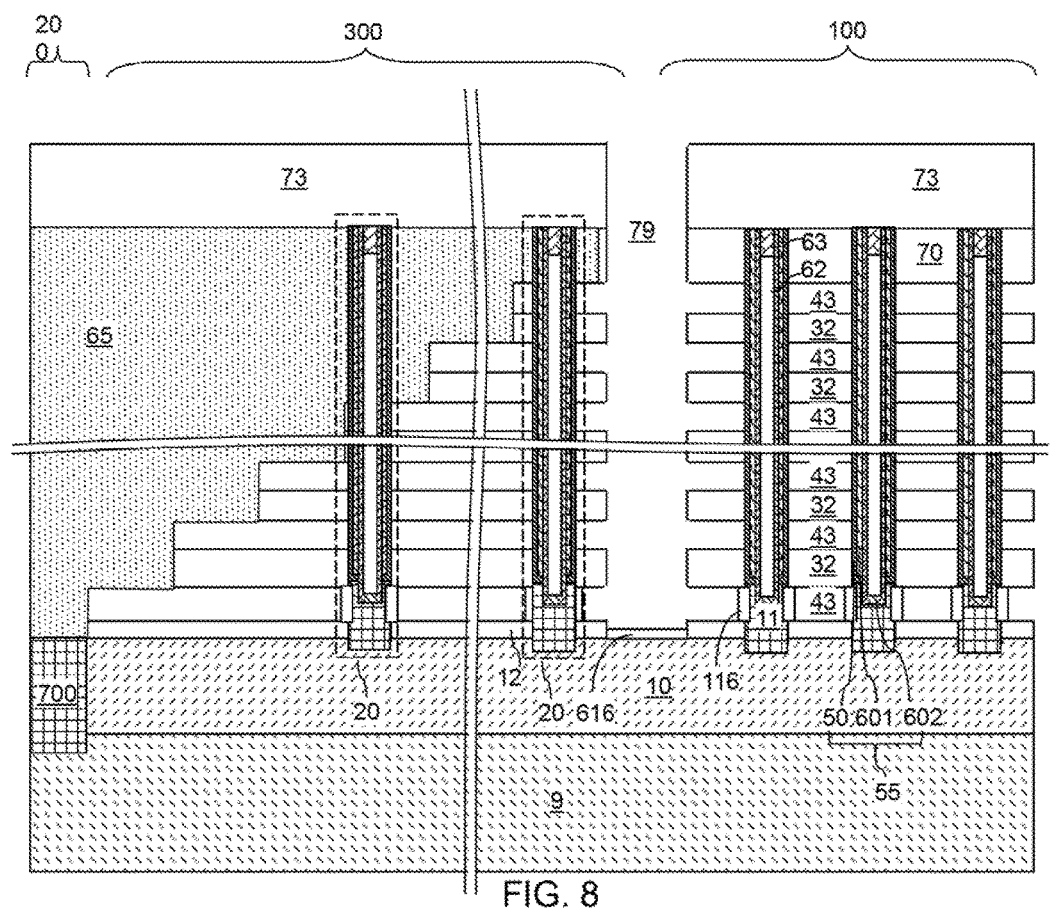
FIG. 8 is a schematic vertical cross-sectional view of the first exemplary structure after formation of backside recesses according to the first embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the first exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and silicon oxide which is the material of the continuous silicon oxide layer 52L. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, portions of the continuous silicon oxide layer 52L can be removed from each level of the backside recesses 43 after removal of the sacrificial material layers 42. For example, an isotropic etch process can be performed to remove the portions of the continuous silicon oxide layer 52L at the levels of the backside recesses 43. For example, a wet etch employing dilute hydrofluoric acid can be performed to etch the portions of the continuous silicon oxide layer 52L at the levels of the backside recesses 43. Portions of the outer sidewall of the continuous charge trapping material layer 54 located at the levels of the backside recesses 43 are physically exposed by the isotropic etch process. Remaining discrete portions of the continuous silicon oxide layer 52L at the levels of the insulating layers 32 include discrete annular silicon oxide portions 52. Each discrete annular silicon oxide portion 52 laterally surrounds the continuous charge trapping material layer 54, and contacts a respective portion of the outer sidewall of the continuous charge trapping material layer 54. The discrete annular silicon oxide portions 52 are vertically separated from each other in a direction perpendicular to the major surface 7 of the substrate (i.e., vertically spaced among one another).

Referring to FIG. 9C, discrete annular charge trapping material portions 58 including a second charge trapping material can be formed by selective deposition of a dielectric (i.e., electrically insulating) second charge trapping material. The selective deposition process deposits the second charge trapping material only from the physically exposed surfaces of the continuous charge trapping material layer 54. During the selective deposition process, the second charge trapping material can grow from physically exposed portions of the outer sidewall of each continuous charge trapping material layer 54 in the memory stack structures 55 at a greater deposition rate than from the surfaces of the insulating layers 32. The difference in the growth rate can be due to the difference in the nucleation time for the second charge trapping material on surfaces of different materials. Specifically, the second charge trapping material can have a shorter nucleation time on surfaces of the first charge trapping material and on surfaces of the second charge trapping material than on surfaces of the insulating layers 32 (i.e., there is an incubation delay of the second charge trapping material on the surfaces of the insulating layers 32).

In one embodiment, the second charge trapping material can grows from physically exposed portions of the outer sidewall of each continuous charge trapping material layer 54 in the memory stack structures 55, and does not grow from surfaces of the insulating layers 32 throughout the duration of the selective deposition process. In another embodiment, the selective deposition process for the second charge trapping material can include a deposition and etching steps. This process includes a charge trapping material deposition process in which the second charge trapping material is deposited on the continuous charge trapping material layer 54 or on previously deposited portions of the second charge trapping material before the charge trapping material begins to nucleate on the insulating layers 32. As the deposition process is continued, the second charge trapping material has a greater thickness on the continuous charge trapping material layer 54 or on previously deposited portions of the second charge trapping material than on the insulating layers 32. The deposition process is followed by a timed etch-back process that completely etches away the thinner portions of the second charge trapping material from surfaces of the insulating layers 32 while leaving a portion of the original thickness of the second charge trapping material on the continuous charge trapping material layer 54 or on previously deposited portions of the second charge trapping material. In some cases, a combination of a charge trapping material deposition process that deposits the second charge trapping material and an etch back process can be repeated multiple times until the discrete annular charge trapping material portions 58 reach a target thickness.

The second charge trapping material may be the same as, or may be different from, the first charge trapping material. In one embodiment, the first charge trapping material can be a first silicon nitride material, and the second charge trapping material can be a second silicon nitride material. In one embodiment, the first silicon nitride material and the second silicon nitride material can have the same composition, i.e., the same silicon to nitrogen ratio. In another embodiment, the first silicon nitride material can be stoichiometric silicon nitride in which the ratio of silicon atoms to nitrogen atoms is 3:4, and the second silicon nitride material can be a silicon-rich nitride material in which the ratio of silicon atoms to nitrogen atoms is greater than 3:4. In a non-limiting illustrative example, the first charge trapping material can be a first silicon nitride material and the insulating layers 32 and the insulating cap layer 70 can include silicon oxide, and the second charge trapping material can be a second silicon nitride material that is deposited by an atomic layer deposition (ALD) or a low pressure chemical vapor deposition (LPCVD) process employing dichlorosilane ($SiH_2Cl_2$) and ammonia ($NH_3$) as reactant gases. In this case, the incubation time before commencement of deposition of the second silicon nitride material is longer on silicon oxide surfaces than on the surfaces of the first silicon nitride material. The deposition process for the second silicon nitride material may be terminated before deposition of the second silicon nitride material on the insulating layers 32, or an etch process (such as a thermally activated etch employing an etchant such as $NF_3$) can be performed until a continuous second silicon nitride material deposited on the surfaces of the insulating layers 32 is completely removed. Optionally, the cycle of the deposition process and the etch process can be repeated until the discrete annular charge trapping material portions 58 reach the target thickness.

The thickness of each discrete annular charge trapping material portion 58, as measured between an inner sidewall and an outer sidewall, can be in a range from 2 nm to 30 nm, such as from 3 nm to 15 nm, although lesser and greater thicknesses can also be employed. In case the discrete annular charge trapping material portions 58 have a greater thickness than the discrete annular silicon oxide portions 52, a horizontal top surface of each discrete annular charge trapping material portion 58 can contact a horizontal bottom surface of an overlying insulating material layer (such as an insulating layer 32 or the insulating cap layer 70), and a horizontal bottom surface of each discrete annular charge trapping material portion 58 can contact a horizontal top surface of an underlying insulating layer 32. In other words, a predominant subset of the discrete annular charge trapping material portions 58 can contact a planar bottom surface of an overlying one of the insulating layers 32 and a planar top surface of an underlying one of the insulating layers 32. As used herein, a "predominant subset" refers to a subset that includes more than 50% of all elements within an entire set. In one embodiment, each of the discrete annular silicon oxide portions 52 can have an outer sidewall such that an upper periphery of the outer sidewall contacts an overlying one of the discrete annular charge trapping material portions 58 and a lower periphery of the outer sidewall contacts an underlying one of the discrete annular charge trapping material portions 58.

Referring to FIG. 9D, at least one backside blocking dielectric layer 44 can be optionally formed. The at least one backside blocking dielectric layer 44 comprises at least one dielectric material that functions as a control gate dielectric for the control gates to be subsequently formed in the backside recesses 43. The at least one backside blocking dielectric layer 44 can be formed in the backside recesses 43 and on a sidewall of the backside trench 79. The at least one backside blocking dielectric layer 44 can be formed directly on horizontal surfaces of the insulating layers 32 and outer sidewalls of the discrete annular charge trapping material portions 58.

In one embodiment, the at least one backside blocking dielectric layer 44 can include a first backside blocking dielectric layer 44A and a second backside blocking dielectric layer 44B. In one embodiment, the first backside blocking dielectric layer 44A can be a continuous silicon oxide layer, and the second backside blocking dielectric layer 44B can be a continuous dielectric metal oxide layer. Each of the first and second backside blocking dielectric layers (44A, 44B) can be formed by a conformal deposition process such as chemical vapor deposition (CVD) or atomic layer deposition (ALD).

The first backside blocking dielectric layer 44A can be formed directly on the discrete annular charge trapping material portions 58 and the insulating layers 32. If the first backside blocking dielectric layer 44A is a continuous silicon oxide layer, the first backside blocking dielectric layer 44A can consist essentially of silicon oxide. The thickness of the first backside blocking dielectric layer 44A can be in a range from 1 nm to 10 nm, such as 2 to 6 nm, although lesser and greater thicknesses can also be employed.

The second backside blocking dielectric layer 44B can be formed directly on the first backside blocking dielectric layer 44A. The dielectric material of the second backside blocking dielectric layer 44B can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. The thickness of the second backside blocking dielectric layer 44B can be in a range from 1 nm to 10 nm, such as from 2 nm to 6 nm, although lesser and greater thicknesses can also be employed. A backside cavity 79' is present within the portion of each backside trench 79 that is not filled with the at least one backside blocking dielectric layer 44.

Referring to FIG. 9E, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 9G:
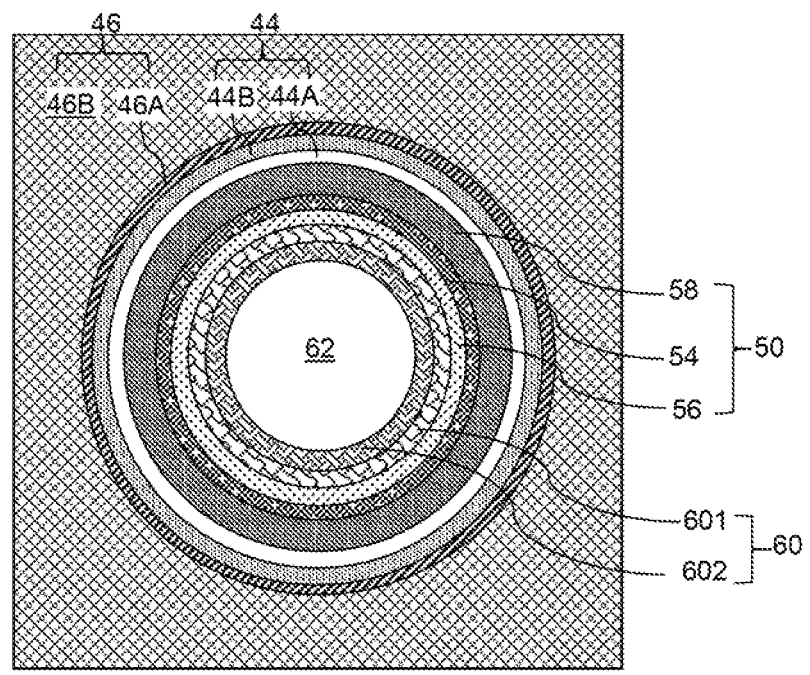
FIG. 9G is a horizontal cross-sectional view of the first exemplary structure of FIG. 9F.
Figure 10:
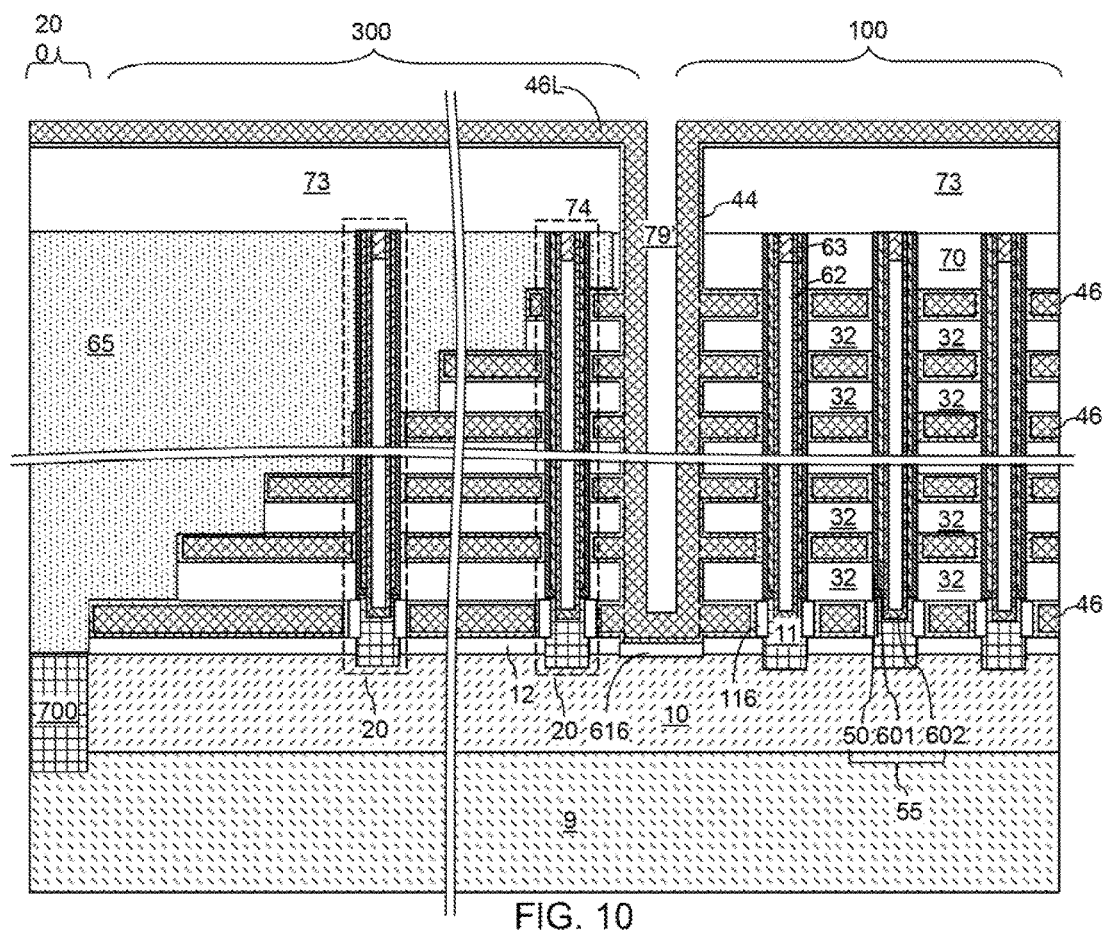
FIG. 10 is a schematic vertical cross-sectional view of the first exemplary structure at the processing step of FIGS. 9F and 9G.

Referring to FIGS. 9F, 9G, and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the at least one backside blocking dielectric layer 44 and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Referring to FIG. 9H, an alternative configuration of the first exemplary structure can be derived from the first exemplary structure after the processing steps of FIG. 9C by forming annular backside blocking dielectric portions 144A in lieu of the first backside blocking dielectric layer 44A. For example, thermal oxidation and/or plasma oxidation can be performed to convert outer surface portions of the discrete annular charge trapping material portions 58 into a predominantly silicon-oxide containing material to form the annular backside blocking dielectric portions 144A. The predominantly silicon-oxide containing material can be a silicon oxide material or a silicon oxynitride material in which oxygen to nitrogen ratio is greater than 3:1, and may be greater than 10:1. The thickness of the annular backside blocking dielectric portions 144A can be in a range from 1 nm to 6 nm, although lesser and greater thicknesses can also be employed.

Referring to FIG. 9I, the processing steps of FIGS. 9D, 9E, and 9F are performed with a modification that the processing step for formation of the first blocking dielectric layer 44A is omitted.

Figure 11:
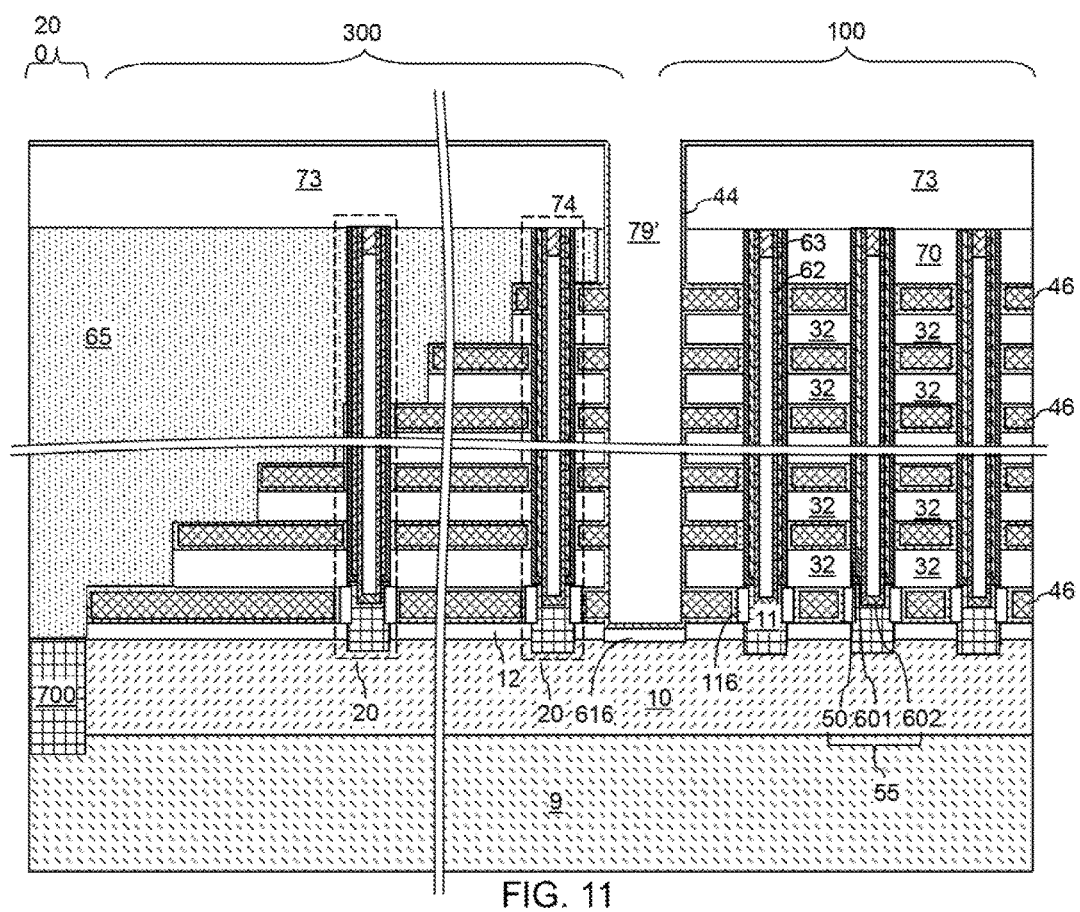
FIG. 11 is a schematic vertical cross-sectional view of the first exemplary structure after removal of a deposited conductive material from within the backside trench according to the first embodiment of the present disclosure.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the at least one backside blocking dielectric layer 44. In this case, a horizontal portion of the at least one backside blocking dielectric layer 44 can be present at the bottom of each backside trench 79. The gate dielectric layer 12 can be vertically spaced from the backside trench 79 by the horizontal portion of the at least one backside blocking dielectric layer 44.

In another embodiment, the removal of the continuous electrically conductive material layer 46L may not be selective to the material of the at least one backside blocking dielectric layer 44 or, the at least one backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. A backside cavity 79' is present within each backside trench 79.

Figure 12A:
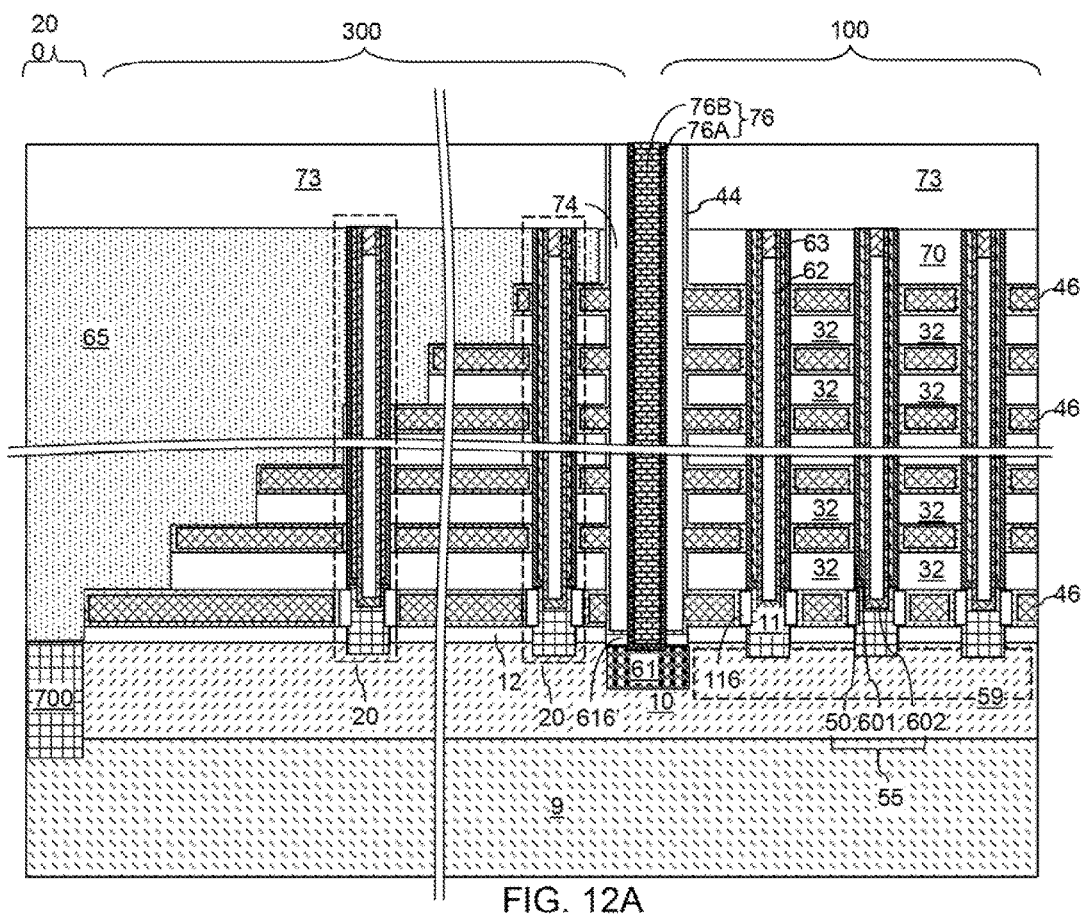
FIG. 12A is a schematic vertical cross-sectional view of the first exemplary structure after formation of an insulating spacer and a backside contact structure according to the first embodiment of the present disclosure.
Figure 12B:
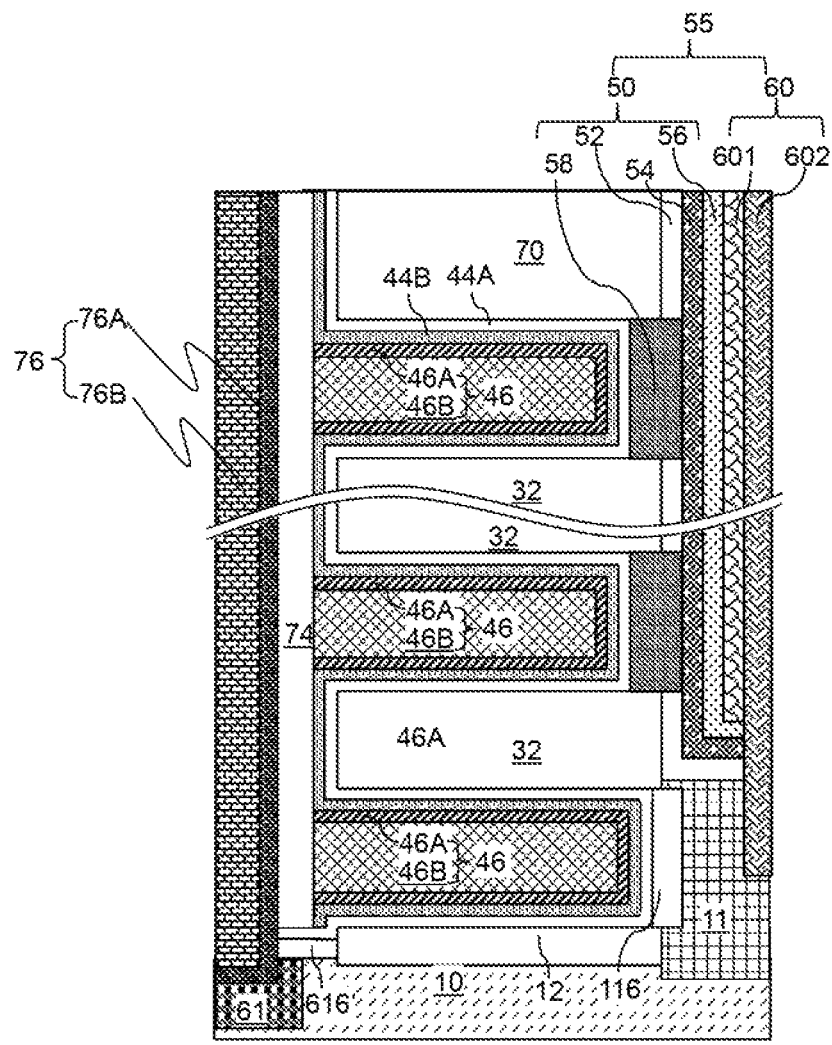
FIG. 12B is a magnified view of a region of the first exemplary structure of FIG. 12A.

Referring to FIGS. 12A and 12B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the at least one backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the at least one backside blocking dielectric layer 44.

Figure 12C:
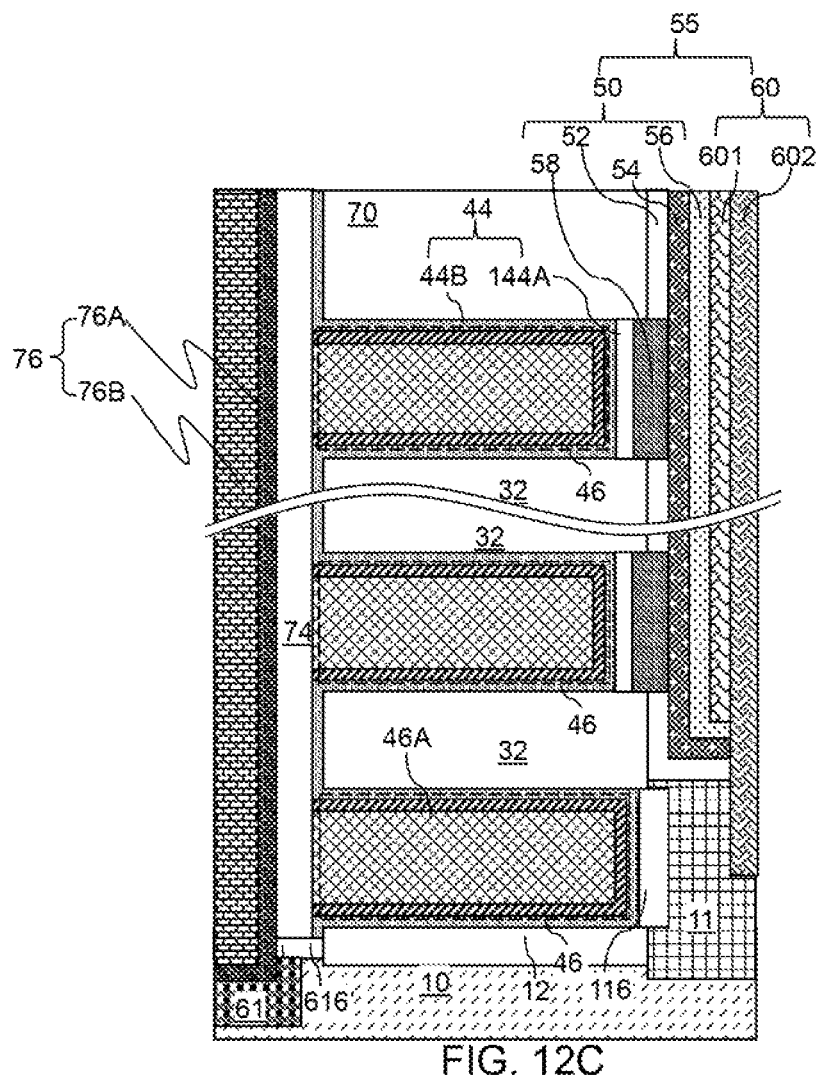
FIG. 12C is a magnified view of a region of the alternative configuration of the first exemplary structure at the processing steps of FIGS. 12A and 12B.

FIG. 12C illustrates the region shown in FIG. 12B in case the alternate configuration of the first exemplary structure is employed in lieu of the configuration illustrated in FIG. 12B.

Figure 13A:
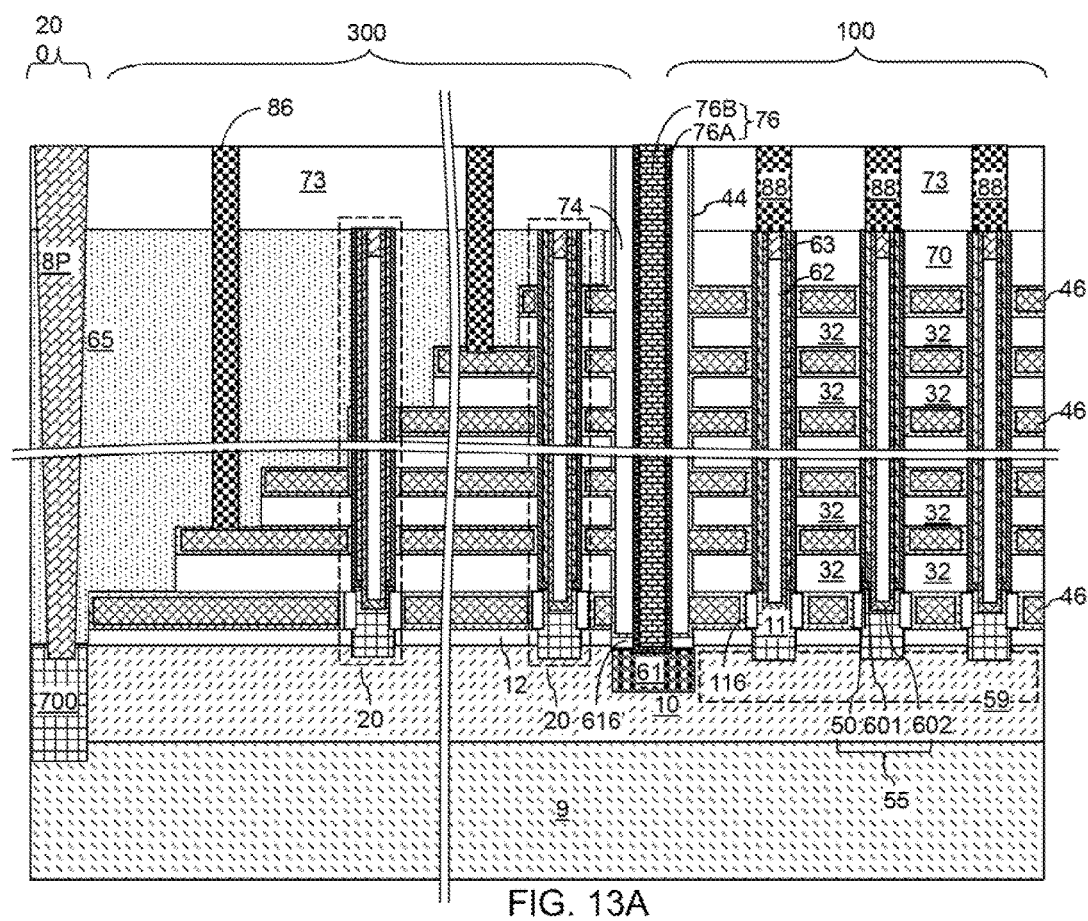
FIG. 13A is a schematic vertical cross-sectional view of the first exemplary structure after formation of additional contact via structures according to the first embodiment of the present disclosure.
Figure 13B:
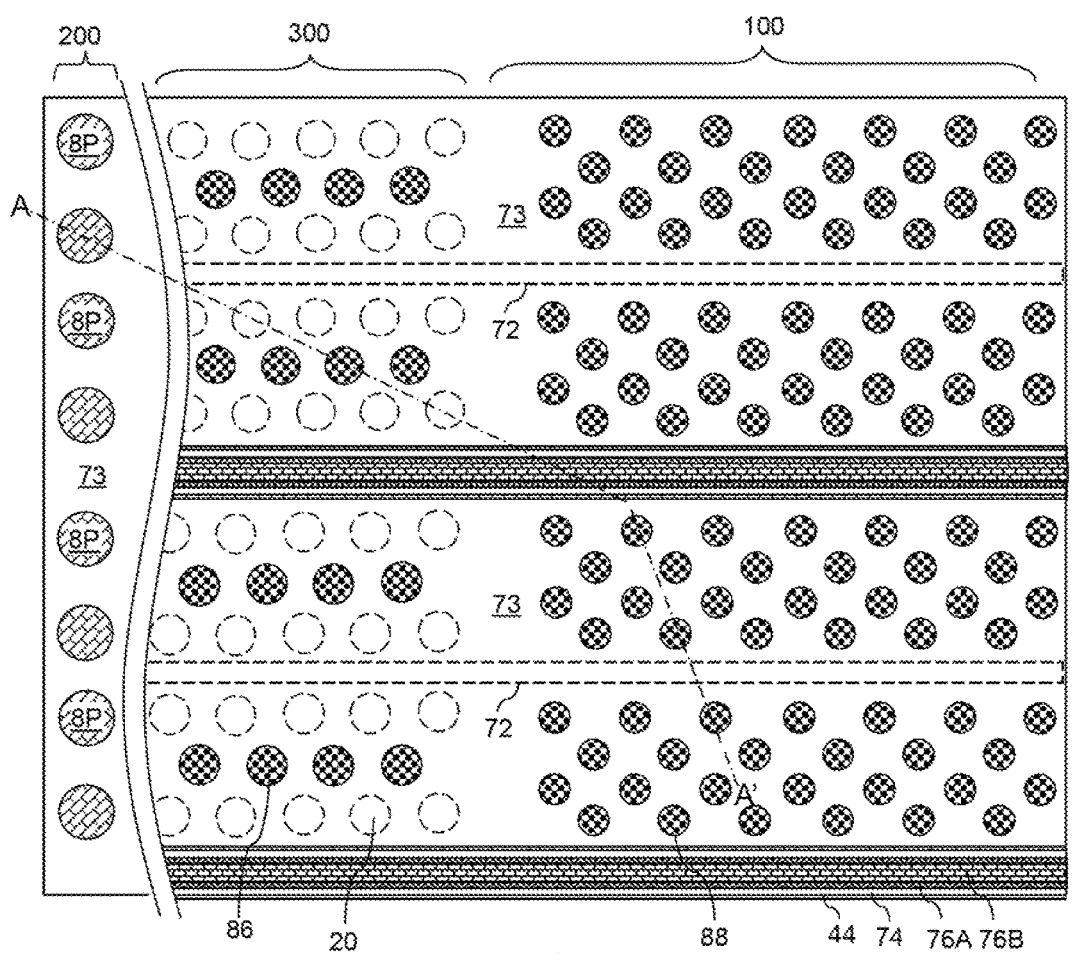
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

According to a second embodiment of the present disclosure, a second exemplary structure according to the second embodiment of the present disclosure can be derived from the first exemplary structure of FIGS. 4A and 4B by forming the memory stack structures 55 with structural modifications. FIGS. 14A-14H illustrate structural changes in a memory opening 49 among the memory openings 49 in the first exemplary structure of FIGS. 4A and 4B. The same structural change occurs simultaneously in each of the other memory openings 49 and in each support opening 19.

Figure 14A:
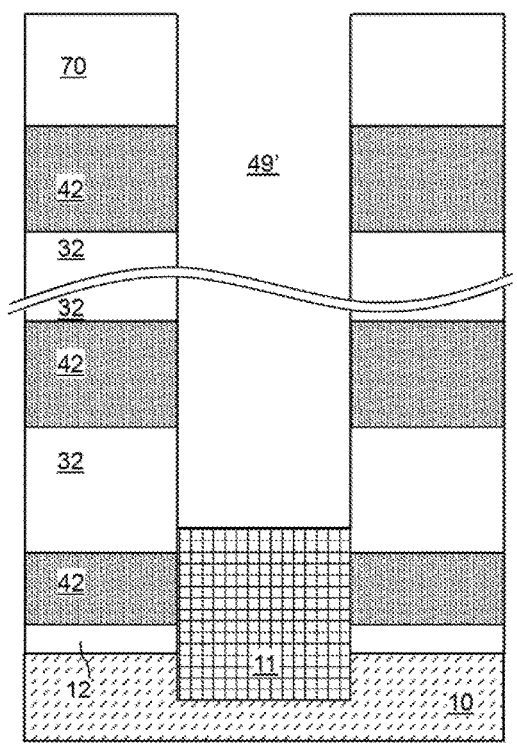
FIGS. 14A-14H are sequential schematic vertical cross-sectional views of a memory opening within a second exemplary structure during formation of a memory stack structure according to a second embodiment of the present disclosure.

Referring to FIG. 14A, the processing steps of FIG. 5B can be performed to form an optional epitaxial channel portion 11 at the bottom portion of each memory opening 49 and each support opening 19. A cavity 49' is present over the epitaxial channel portion 11 within each memory opening 49 and within each support opening 19.

Figure 14B:
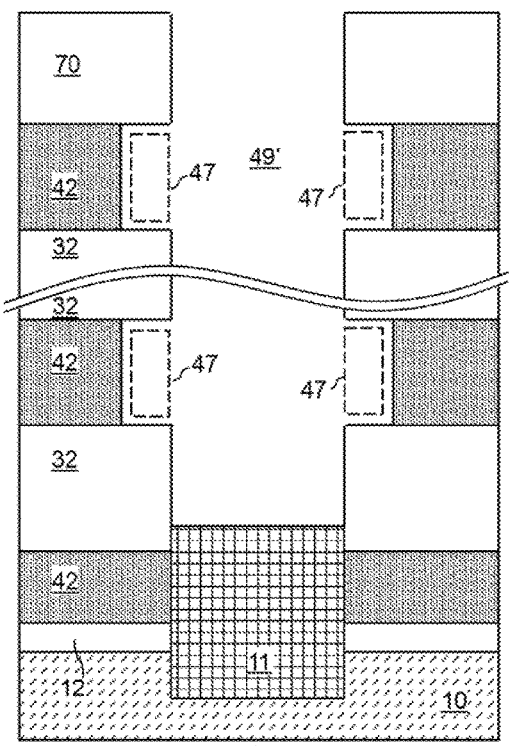

Referring to FIG. 14B, an isotropic etch process can be performed to laterally recess the sidewalls of the sacrificial material layer 42 relative to the sidewalls of the insulating layers 32 and the insulating cap layer 70 around each cavity 49'. The isotropic etch process can be a selective etch process that etches the material of the sacrificial material layers 42 selective to the materials of the insulating layers 32 and the insulating cap layer 70. For example, if the insulating layers 32 and the insulating cap layer 70 include silicon oxide and if the sacrificial material layers 42 include silicon nitride, a wet etch employing hot phosphoric acid can be employed to etch the material of the sacrificial material layers 42 selective to the materials of the insulating layers 32 and the insulating cap layer 70.

Annular recesses 47 are formed at each level of the sacrificial material layers 42 around each memory opening 49 and around each support opening 19 by laterally recessing the sidewalls of the sacrificial material layers 42 with respect to sidewalls of the insulating layers 32. As used herein, an "annular" element refers to an element having an annular shape, i.e., a ring-shaped element. Each annular recess 47 is a portion of the cavity 49' as expanded by the isotropic etch process. Specifically, each annular recess 47 is the expanded portion of the volume of a respective cavity 49' that is located at one of the levels of the sacrificial material layers 42. The distance of the lateral recess of the sacrificial material layers 42 can be in a range from 3 nm to 60 nm, such as from 6 nm to 30 nm, although lesser and greater lateral recess distances can also be employed.

Figures 14C, 14D:
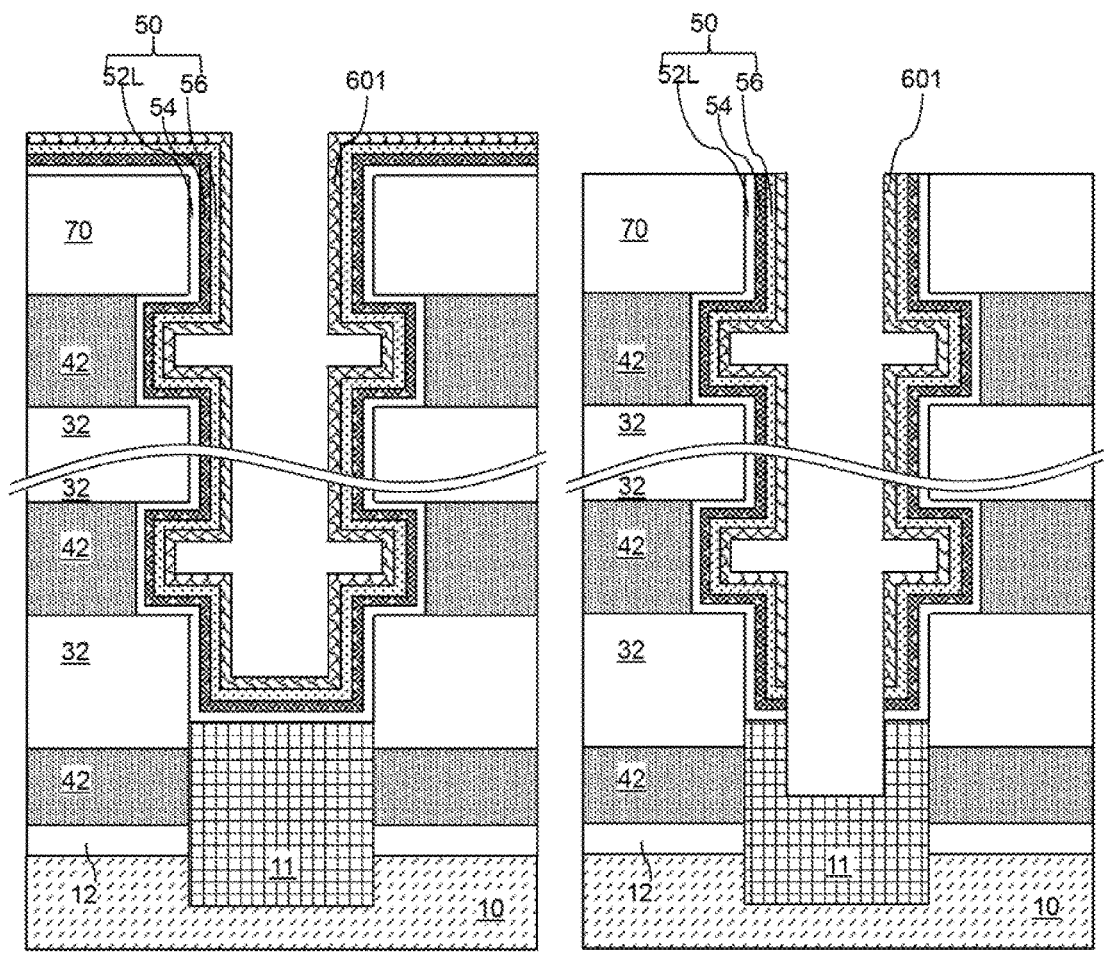

Referring to FIG. 14C, the processing steps of FIG. 5C can be performed to form a stack of layers including a continuous silicon oxide layer 52L, a continuous charge trapping material layer 54, a tunneling dielectric layer 56, and an optional first semiconductor channel layer 601 which are sequentially deposited in the memory openings 49. Each of the continuous silicon oxide layer 52L, the continuous charge trapping material layer 54, the tunneling dielectric layer 56, and the optional first semiconductor channel layer 601 can have the same composition as, and/or the same thickness as, in the first embodiment. Alternatively, at least one of the continuous silicon oxide layer 52L, the continuous charge trapping material layer 54, the tunneling dielectric layer 56, and the optional first semiconductor channel layer 601 can have a thickness that is less than the thickness of the corresponding layer in the first embodiment.

Each of the continuous silicon oxide layer 52L, the continuous charge trapping material layer 54, the tunneling dielectric layer 56, and the optional first semiconductor channel layer 601 can include laterally protruding portions at each level of the sacrificial material layers 42. Each laterally protruding portion can have a generally annular shape, and can protrude into a respective one of the annular recesses 47. In one embodiment, each of the continuous silicon oxide layer 52L, the continuous charge trapping material layer 54, the tunneling dielectric layer 56, and the optional first semiconductor channel layer 601 can have an annular upper horizontal portion, a vertical portion adjoined to the upper annular horizontal portion, and an annular lower horizontal portion within each of the annular recesses 47.

Referring to FIG. 14D, the processing steps of FIG. 5D can be performed to anisotropically etch each of the optional first semiconductor channel layer 601, the tunneling dielectric layer 56, the continuous charge trapping material layer 54, and the continuous silicon oxide layer 52L. A surface of the epitaxial channel portion 11 (or a surface of the semiconductor material layer 10 in case the epitaxial channel portions 11 are not employed) can be physically exposed underneath the opening through the first semiconductor channel layer 601, the tunneling dielectric layer 56, the continuous charge trapping material layer 54, and the continuous silicon oxide layer 52L as in the first embodiment. In one embodiment, an annular cavity bounded by inner surfaces of the first semiconductor channel layer 601 may be present within each of the annular recesses.

Figure 14E:
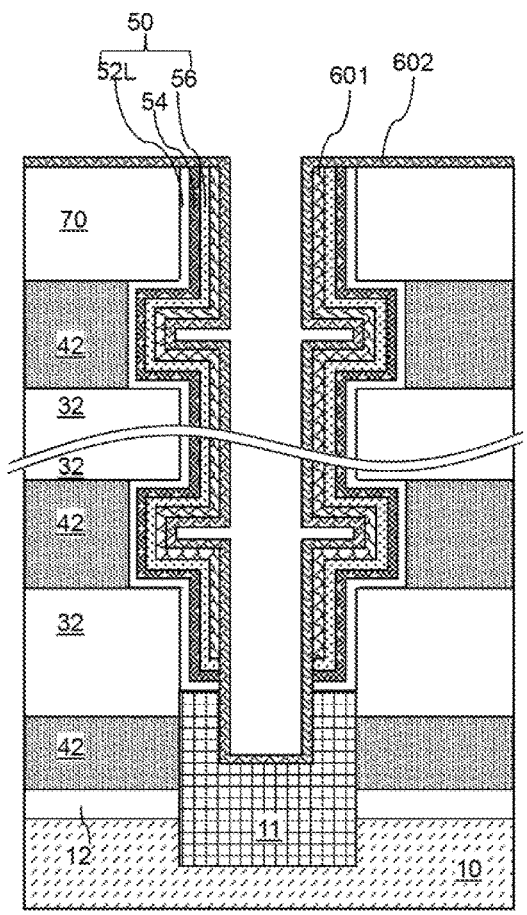

Referring to FIG. 14E, the processing steps of FIG. 5E can be performed to form a second semiconductor channel layer 602. The second semiconductor channel layer 602 can have the same composition as, and the same thickness as, in the first embodiment. Alternatively, the thickness of the second semiconductor channel layer 602 can be less than the second semiconductor channel layer 602 of the first embodiment. The second semiconductor channel layer 602 may completely fill the annular cavities defined by the inner surfaces of the first semiconductor channel layer 601 at each level of the sacrificial material layers 42, or an annular cavity having a reduced volume may be present at each level of the sacrificial material layers 42 after formation of the second semiconductor channel layer 602.

Figure 14F:
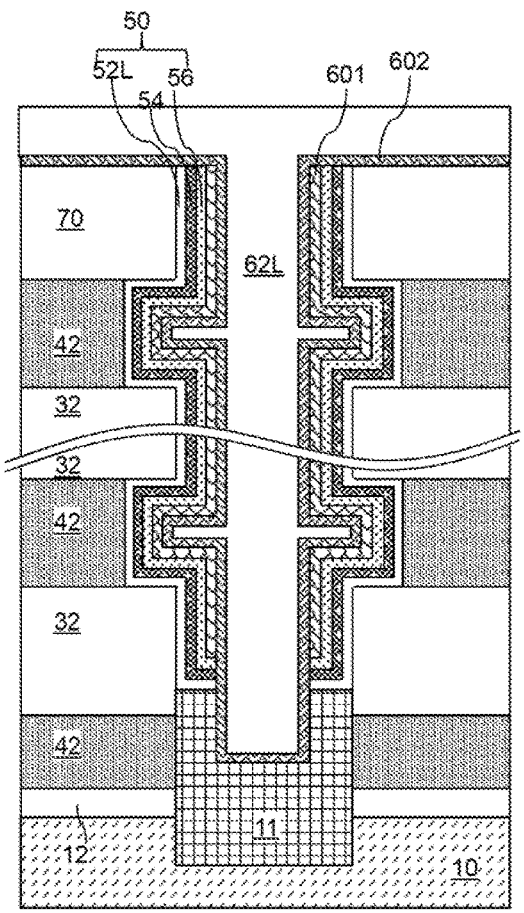

Referring to FIG. 14F, the processing steps of FIG. 5F can be performed to form a dielectric core layer 62L.

Figures 14G, 14H:
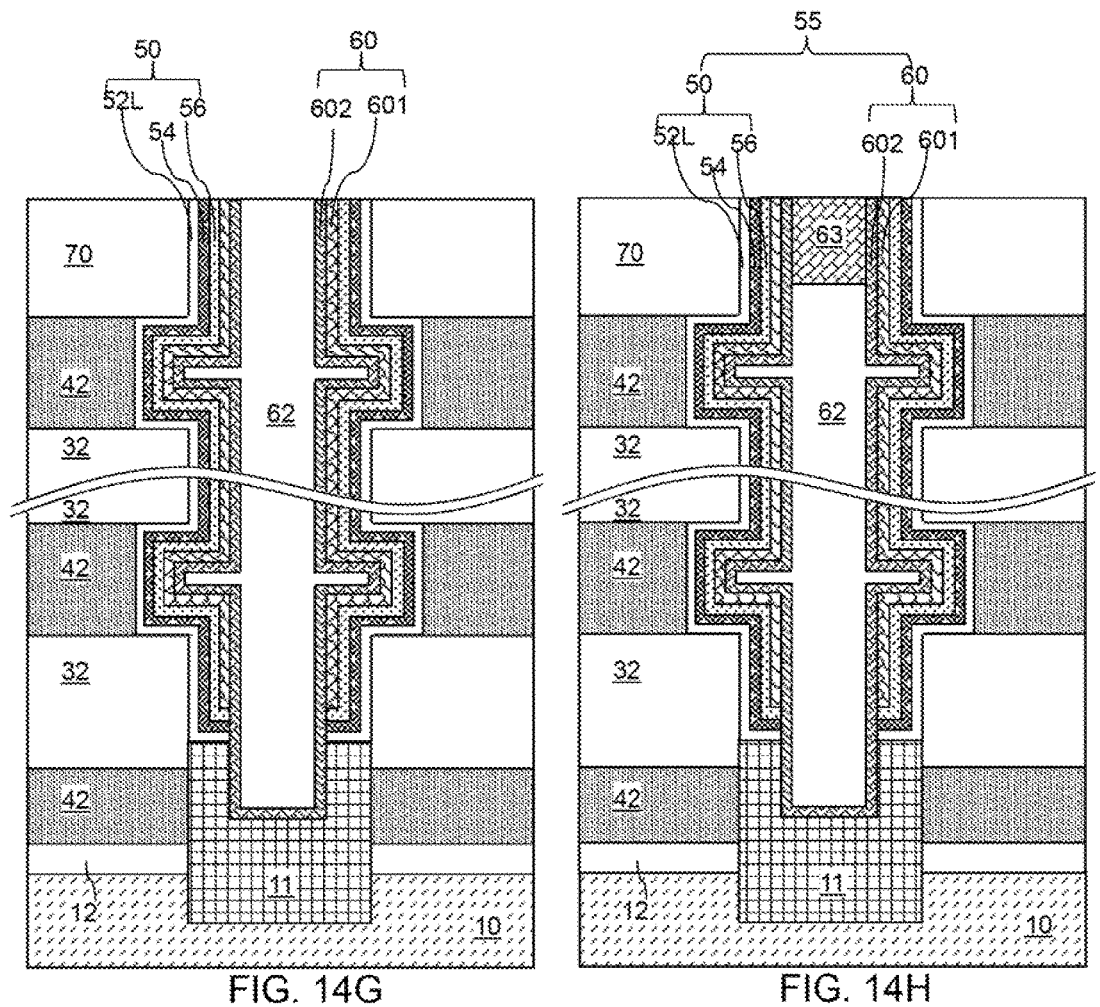

Referring to FIG. 14G, the processing steps of FIG. 5G can be performed to form a dielectric core 62 within each of the memory openings 49 and within each of the support openings 19.

Referring to FIG. 14H, the processing steps of FIG. 5H can be performed to form a drain region 63 at an upper end of each layer stack of a first semiconductor channel layer 601 and a second semiconductor channel layer 602, which collectively constitute a vertical semiconductor channel 60.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the continuous charge trapping material layer 54, and an optional continuous silicon oxide layer 52L. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial channel portion 11 (if present), a memory film 50, a vertical semiconductor channel 60, a dielectric core 62, and a drain region 63 within each support opening 19 fills the respective support openings 19, and constitutes a support pillar structure 20. A combination of an epitaxial channel portion 11 and a memory stack structure fills each memory opening 49, and a support pillar structure 20 fills each support opening 19 as illustrated in FIG. 6. It is understood that the shapes of the memory stack structures 55 and the support pillar structures 20 include laterally protruding portions in the second exemplary structure at the processing steps corresponding to the processing steps of FIG. 6.

Subsequently, the processing steps of FIGS. 7A, 7B, and 8 are performed in the same manner as in the first embodiment. FIG. 15A illustrates a region of the second exemplary structure after the processing steps of FIG. 8.

Specifically, backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and silicon oxide which is the material of the continuous silicon oxide layer 52L. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 15B, annular vertical portions of the continuous silicon oxide layer 52L can be removed from each level of the backside recesses 43 after removal of the sacrificial material layers 42. For example, an isotropic etch process can be performed to remove the portions of the continuous silicon oxide layer 52L at the levels of the backside recesses 43. For example, a wet etch employing dilute hydrofluoric acid can be performed to etch the portions of the continuous silicon oxide layer 52L at the levels of the backside recesses 43. Portions of the outer sidewall of the continuous charge trapping material layer 54 located at the levels of the backside recesses 43 are physically exposed by the isotropic etch process.

Remaining discrete portions of the continuous silicon oxide layer 52L at the levels of the insulating layers 32 include discrete annular silicon oxide portions 52. Each discrete annular silicon oxide portion 52 laterally surrounds the continuous charge trapping material layer 54, and contacts a respective portion of the outer sidewall of the continuous charge trapping material layer 54. The discrete annular silicon oxide portions 52 are vertically separated from each other in a direction perpendicular to the top surface 7 of the substrate (i.e., vertically spaced among one another). In one embodiment, each of the discrete annular silicon oxide portions 52 comprises: a vertical portion 52V that extends through a respective insulating layer 32 and contacting the proximal sidewall of the respective insulating layer 32, an upper annular horizontal portion 52U that contacts an annular area of a top surface of the respective one of the insulating layers 32, and a lower annular horizontal portion 52B that contacts an annular area of a bottom surface of the respective one of the insulating layers. Depending on the amount of overetch on the continuous silicon oxide layer 52L, the outermost sidewalls of the discrete annular silicon oxide portions 52 may protrude less along a lateral direction than the outermost sidewalls of the continuous charge trapping material layer 54. In other words, the outermost sidewalls of the continuous charge trapping material layer 54 may laterally extend farther from a vertical axis passing through a geometrical center (as defined as the center of the volume) of the memory stack structure 55 than the outermost sidewalls of the discrete annular silicon oxide portions 52.

Referring to FIG. 15C, the processing steps of FIG. 9C can be performed to form discrete annular charge trapping material portions 58 including a second charge trapping material. A selective deposition process can be employed as in the first embodiment with at least one optional etch process. The charge trapping material grows from physically exposed portions of an outer sidewall of the continuous charge trapping material layer 54. In one embodiment, the selective deposition of the charge trapping material can comprise at least one charge trapping material deposition process in which the second charge trapping material is deposited on the continuous charge trapping material layer 54 or on previously deposited portions of the second charge trapping material, and at least one etch-back process that isotropically etches portions of the second charge trapping material from surfaces of the insulating layers 32.

The second charge trapping material may be the same as, or may be different from, the first charge trapping material. In one embodiment, the first charge trapping material can be a first silicon nitride material, and the second charge trapping material can be a second silicon nitride material. In one embodiment, the first silicon nitride material and the second silicon nitride material can have the same composition, i.e., the same silicon to nitride ratio. In another embodiment, the first silicon nitride material can be stoichiometric silicon nitride in which the ratio of silicon atoms to nitrogen atoms is 3:4, and the second silicon nitride material can be a silicon-rich nitride material in which the ratio of silicon atoms to nitrogen atoms is greater than 3:4. The thickness of each discrete annular charge trapping material portion 58, as measured between an inner sidewall and an outer sidewall, can be in a range from 2 nm to 30 nm, such as from 3 nm to 15 nm, although lesser and greater thicknesses can also be employed.

In one embodiment the upper portion and the lower portion of each discrete annular charge trapping material portion 58 may have a respective convex surface because the material of the discrete annular charge trapping material portions 58 is deposited along all possible directions during selective deposition of the discrete annular charge trapping material portions 58. Further, each of the discrete annular charge trapping material portions 58 may include an upper portion and a lower portion that laterally protrude toward the geometrical center of the memory stack structure 55 to physically contact outermost sidewalls of the discrete annular silicon oxide portions 52.

An entire horizontal top surface of each discrete annular charge trapping material portion 58 can contact a horizontal bottom surface of an overlying insulating material layer (such as an insulating layer 32 or the insulating cap layer 70), and an entire horizontal bottom surface of each discrete annular charge trapping material portion 58 can contact a horizontal top surface of an underlying insulating layer 32. In other words, a predominant subset of the discrete annular charge trapping material portions 58 can contact a planar bottom surface of an overlying one of the insulating layers 32 and a planar top surface of an underlying one of the insulating layers 32. Alternatively, a space remains between the annular charge trapping material portions 58 and the insulating layers 32 such that they do not contact each other.

Referring to FIG. 15D, at least one backside blocking dielectric layer 44 can be optionally formed as in the first embodiment. The at least one backside blocking dielectric layer 44 comprises at least one dielectric material that functions as a control gate dielectric for the control gates to be subsequently formed in the backside recesses 43. The at least one backside blocking dielectric layer 44 can be formed in the backside recesses 43 and on a sidewall of the backside trench 79. The at least one backside blocking dielectric layer 44 can be formed directly on horizontal surfaces of the insulating layers 32 and outer sidewalls of the discrete annular charge trapping material portions 58. In one embodiment, the at least one backside blocking dielectric layer 44 can include a first backside blocking dielectric layer 44A and a second backside blocking dielectric layer 44B. In one embodiment, the first backside blocking dielectric layer 44A can be a continuous silicon oxide layer, and the second backside blocking dielectric layer 44B can be a continuous dielectric metal oxide layer. Each of the first and second backside blocking dielectric layers (44A, 44B) can be formed by a conformal deposition process such as chemical vapor deposition (CVD) or atomic layer deposition (ALD).

Referring to FIG. 15E, a metallic barrier layer 46A can be deposited in the backside recesses 43 by performing the processing steps of FIG. 9E. The metallic barrier layer 46A includes an electrically conductive metallic material that can function as a diffusion barrier layer and/or adhesion promotion layer for a metallic fill material to be subsequently deposited.

Referring to FIG. 15F, a metal fill material is deposited in the plurality of backside recesses 43, on the sidewalls of the at least one the backside trench 79, and over the top surface of the contact level dielectric layer 73 to form a metallic fill material layer 46B by performing the processing steps of FIG. 9F.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the at least one backside blocking dielectric layer 44 and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 16:
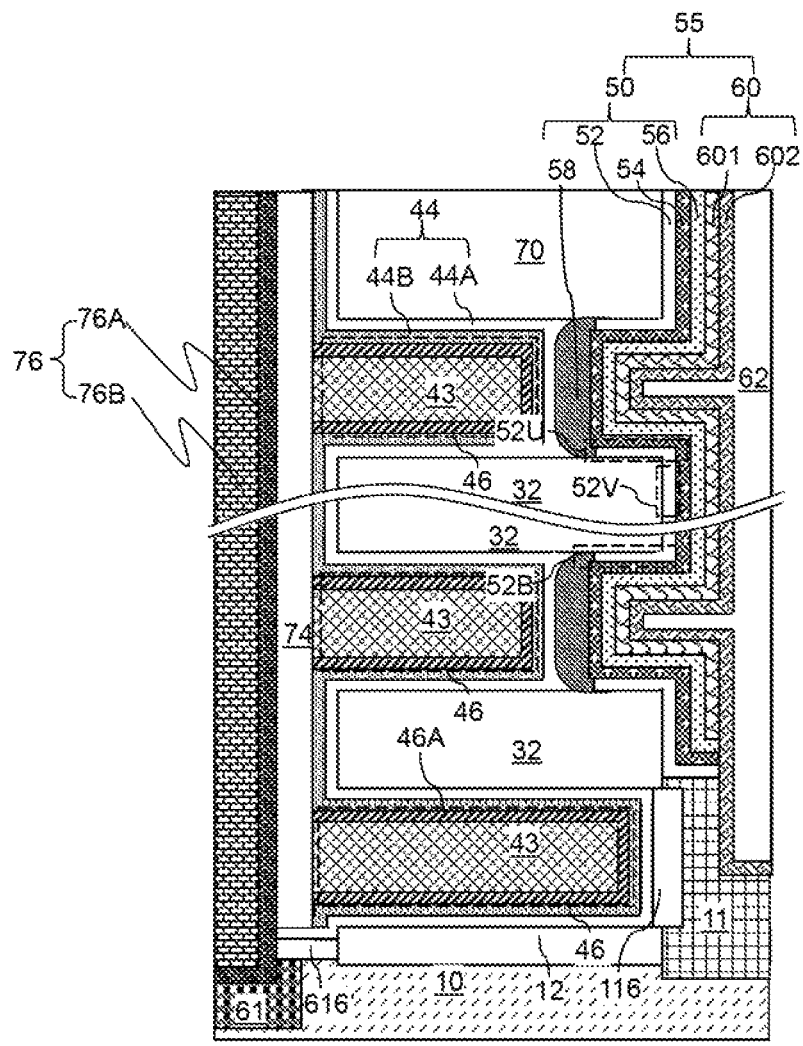
FIG. 16 is a magnified view of a region of the second exemplary structure at a processing step that corresponds to the processing step of FIGS. 12A and 12B.

Then, the processing steps of FIGS. 11, 12A, and 12B are performed. FIG. 16 illustrates a region of the second exemplary structure after formation of an insulating spacer 74, a source region 61, and a backside contact via structure 76. Subsequently, the processing steps of FIGS. 13A and 13B can be performed to form various contact via structures (88, 86, 8P).

Figures 17A, 17B:
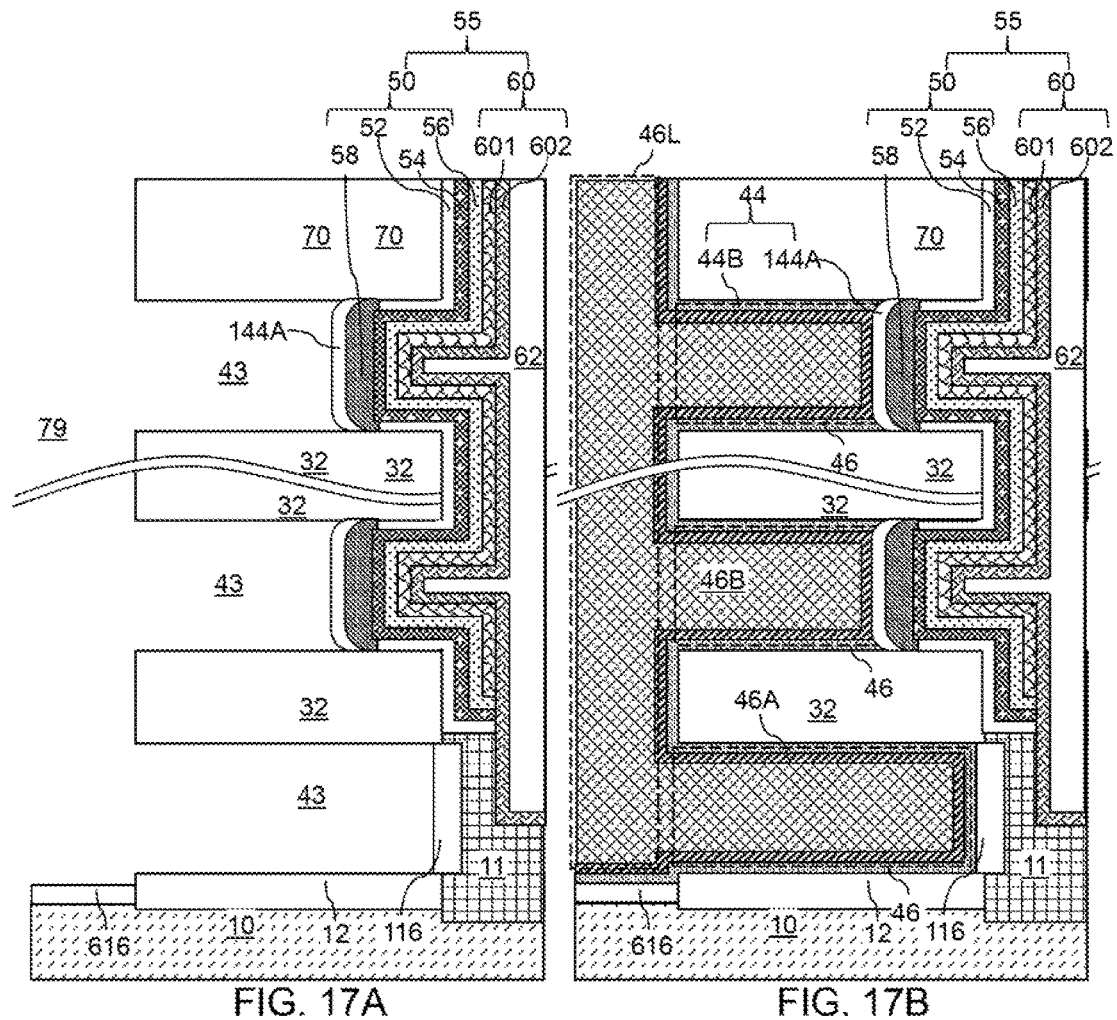
FIGS. 17A-17B are sequential vertical cross-sectional views of a region of an alternative configuration of the second exemplary structure during formation of electrically conductive layers according to the second embodiment of the present disclosure.

Referring to FIG. 17A, an alternative configuration of the second exemplary structure can be derived from the second exemplary structure after the processing steps of FIG. 15C by forming annular backside blocking dielectric portions 144A in lieu of the first backside blocking dielectric layer 44A. For example, thermal oxidation and/or plasma oxidation can be performed to convert outer surface portions of the discrete annular charge trapping material portions 58 into a predominantly silicon-oxide containing material to form the annular backside blocking dielectric portions 144A. The predominantly silicon-oxide containing material can be a silicon oxide material or a silicon oxynitride material in which oxygen to nitrogen ratio is greater than 3:1, and may be greater than 10:1. The thickness of the annular backside blocking dielectric portions 144A can be in a range from 1 nm to 6 nm, although lesser and greater thicknesses can also be employed. The annular backside blocking dielectric portions 144A can have a convex outer surface and a convex inner surface which contacts the convex outer surface of the discrete annular charge trapping material portions 58.

Referring to FIG. 17B, the processing steps of FIGS. 15D, 15E, and 15F are performed with a modification that the processing step for formation of the first blocking dielectric layer 44A is omitted.

Figure 18:
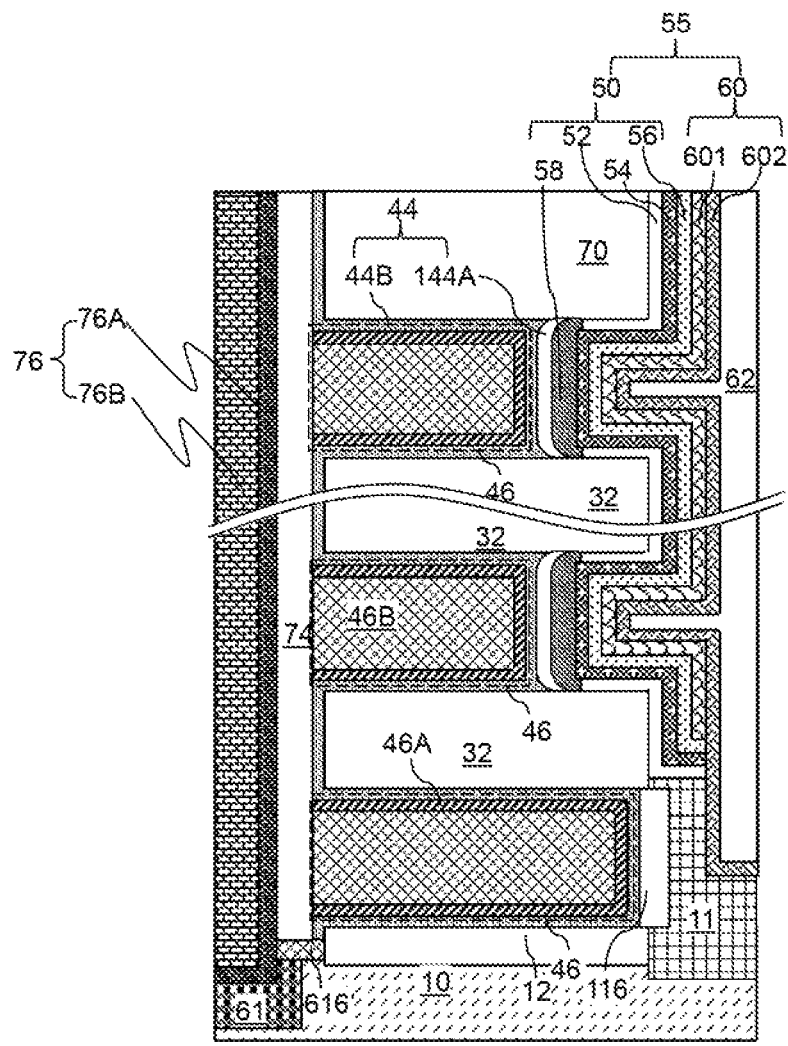
FIG. 18 is a magnified view of a region of the alternative configuration of the second exemplary structure at a processing step that corresponds to the processing step of FIGS. 12A and 12B.

FIG. 18 illustrates the region shown in FIG. 16 in case the alternate configuration of the first exemplary structure is employed in lieu of the configuration illustrated in FIG. 16.

Each of the first and second exemplary structures can include a three-dimensional memory device, which can comprise an alternating stack of insulating layers 32 and electrically conductive layers 46 located over a substrate (9, 10); and memory stack structures 55 extending through the alternating stack (32, 46), wherein each of the memory stack structures 55 comprises a memory film 50 and a vertical semiconductor channel 60 contacting an inner sidewall of the memory film 50. The memory film 50 comprises: a continuous charge trapping material layer 54 comprising a dielectric first charge trapping material and extending through multiple electrically conductive layers 46 within the alternating stack (32, 46); and discrete annular charge trapping material portions 58 comprising a dielectric second charge trapping material and located at levels of the electrically conductive layers 46, vertically separated from each other in a direction perpendicular to the top surface 7 of the substrate (i.e., vertically spaced among one another), and contacting an outer sidewall of the continuous charge trapping material layer 54.

In one embodiment, the first charge trapping material and the second charge trapping material have different material compositions. In another embodiment, the first charge trapping material and the second charge trapping material the same material compositions. For example, the first charge trapping material and the second charge trapping material may comprise silicon nitride having the same or different ratios of silicon to nitrogen. In one embodiment, each of the discrete annular charge trapping material portions 58 contacts a planar bottom surface of an overlying one of the insulating layers 32 and a planar top surface of an underlying one of the insulating layers 32. In one embodiment, each contact area between the discrete annular charge trapping material portions 58 and the insulating layers 32 has an annular shape. In one embodiment, the spacing between the outer periphery and the inner periphery of the annular shape can be uniform throughout the annular shape. The outer periphery and the inner periphery of the annular shape may be circular, elliptical, or of another concave shape. In one embodiment, the inner periphery and the outer periphery of the annular shape may be concentric.

In one embodiment, the three-dimensional memory device can further include a first backside blocking dielectric layer 44A contacting the discrete annular charge trapping material portions 58 and the insulating layers 32 and comprising silicon oxide, and a second backside blocking dielectric layer 44B contacting the first backside blocking dielectric layer 44A and the electrically conductive layers 46 and comprising a dielectric metal oxide.

In one embodiment, portions of an outer sidewall of the continuous charge trapping material layer 54 located at levels of the electrically conductive layers 46 can be vertically coincident with portions of the outer sidewall of the continuous charge trapping material layer 54 located at levels of the insulating layers 32 as illustrated in the first exemplary structure.

In one embodiment, portions of an outer sidewall of the continuous charge trapping material layer 54 located at levels of the electrically conductive layers 46 can protrude outward with respect to the vertical channel 60 compared to portions of the outer sidewall of the continuous charge trapping material layer 54 located at levels of the insulating layers 32 as illustrated in the second exemplary structure.

In one embodiment, the three-dimensional memory device can include discrete annular silicon oxide portions 52 located at levels of the insulating layers 32, vertically separated from each other in a direction perpendicular to the top surface 7 of the substrate (i.e., vertically spaced among one another), and contacting the outer sidewall of the continuous charge trapping material layer 54.

In one embodiment, each of the discrete annular silicon oxide portions 52 can have an outer sidewall, wherein an upper periphery of the outer sidewall contacts an overlying one of the discrete annular charge trapping material portions 58 and a lower periphery of the outer sidewall contacts an underlying one of the discrete annular charge trapping material portions 58 as illustrated in the first exemplary structure.

In one embodiment, each of the discrete annular silicon oxide portions 52 comprises: a vertical portion 52V that extends through a respective one of the insulating layers 32; an upper annular horizontal portion 52U that contacts an annular area of a top surface of the respective one of the insulating layers 32; and a lower annular horizontal portion 52B that contacts an annular area of a bottom surface of the respective one of the insulating layers 32 as illustrated in FIG. 16.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). Support pillar structures 20 can extend through the stepped surfaces and through a retro-stepped dielectric material portion 65 that overlies the stepped surfaces.

Each of the first and second exemplary structures can include a three-dimensional memory device. The three-dimensional memory device can comprise a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The monolithic three-dimensional NAND memory device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), and the plurality of control gate electrodes can comprise at least a first control gate electrode located in the first device level and a second control gate electrode located in the second device level.

The array of monolithic three-dimensional NAND strings can comprise: a plurality of semiconductor channels (59, 11, 60), wherein at least one end portion of each of the plurality of semiconductor channels (59, 11, 60) extends substantially perpendicular to a top surface of the substrate (9, 10), and a plurality of charge storage elements (as embodied as each combination of a discrete annular charge trapping material portion 58 and a portion of the continuous charge trapping material layer 54 located at the same level as the discrete annular charge trapping material portion 58), and each charge storage element (54, 58) can be located adjacent to a respective one of the plurality of semiconductor channels (59, 11, 60).

One non-limiting advantage of the present disclosure is that the thicker discrete charge trapping material portions 58 can function as primary charge storage regions, and inter-level charge leakage can be minimized by the vertically separated portions 58 and the small thickness of the thin continuous charge trapping material layer 54. The thin continuous charge trapping material layer 54 acts as a seed layer for the selective growth of the discrete portions 58 without significantly increasing process complexity or introducing a seed layer which negatively affects the process or device properties due to crystallization, etc.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    an alternating stack of insulating layers and electrically conductive layers located over a substrate; and
    memory stack structures extending through the alternating stack, wherein each of the memory stack structures comprises a memory film and a vertical semiconductor channel contacting an inner sidewall of the memory film,
    wherein the memory film comprises:
        a continuous charge trapping material layer comprising a dielectric first charge trapping material and extending through multiple electrically conductive layers within the alternating stack; and
        discrete charge trapping material portions comprising a dielectric second charge trapping material and located at levels of the electrically conductive layers, vertically separated from each other, and contacting an outer sidewall of the continuous charge trapping material layer.

2. The three-dimensional memory device of claim 1, wherein the first charge trapping material and the second charge trapping material comprise silicon nitride having the same or different composition.

3. The three-dimensional memory device of claim 1, wherein each of the discrete charge trapping material portions comprise annular portions which contact a planar bottom surface of an overlying one of the insulating layers and a planar top surface of an underlying one of the insulating layers.

4. The three-dimensional memory device of claim 3, wherein each contact area between the discrete annular charge trapping material portions and the insulating layers has an annular shape.

5. The three-dimensional memory device of claim 1, further comprising:
    a first backside blocking dielectric layer contacting the discrete charge trapping material portions and the insulating layers and comprising silicon oxide; and a second backside blocking dielectric layer contacting the first backside blocking dielectric layer and the electrically conductive layers and comprising a dielectric metal oxide.

6. The three-dimensional memory device of claim 1, wherein portions of an outer sidewall of the continuous charge trapping material layer located at levels of the electrically conductive layers are vertically coincident with portions of the outer sidewall of the continuous charge trapping material layer located at levels of the insulating layers.

7. The three-dimensional memory device of claim 1, wherein portions of an outer sidewall of the continuous charge trapping material layer located at levels of the electrically conductive layers protrude outward with respect to portions of the outer sidewall of the continuous charge trapping material layer located at levels of the insulating layers.

8. The three-dimensional memory device of claim 1, further comprising discrete silicon oxide portions located at levels of the insulating layers, vertically separated from each other, and contacting the outer sidewall of the continuous charge trapping material layer.

9. The three-dimensional memory device of claim 8, wherein each the discrete silicon oxide portions has an outer sidewall, wherein an upper periphery of the outer sidewall contacts an overlying one of the discrete charge trapping material portions and a lower periphery of the outer sidewall contacts an underlying one of the discrete charge trapping material portions.

10. The three-dimensional memory device of claim 8, wherein each of the discrete silicon oxide portions comprises:
    a vertical portion that extends through a respective one of the insulating layers;
    an upper annular horizontal portion that contacts an annular area of a top surface of the respective one of the insulating layers; and
    a lower annular horizontal portion that contacts an annular area of a bottom surface of the respective one of the insulating layers.

11. The three-dimensional memory device of claim 1, wherein:
    the alternating stack comprises a terrace region in which each electrically conductive layer other than a topmost electrically conductive layer within the alternating stack laterally extends farther than any overlying electrically conductive layer within the alternating stack;
    the terrace region includes stepped surfaces of the alternating stack that continuously extend from a bottommost layer within the alternating stack to a topmost layer within the alternating stack; and
    support pillar structures extend through the stepped surfaces and through a retro-stepped dielectric material portion that overlies the stepped surfaces.

12. The three-dimensional memory device of claim 1, wherein:
    the three-dimensional memory device comprises a monolithic three-dimensional NAND memory device;
    the electrically conductive layers comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;
    the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
    the array of monolithic three-dimensional NAND strings comprises:
    a plurality of semiconductor channels, wherein at least one end portion of each of the plurality of semiconductor channels extends substantially perpendicular to a top surface of the substrate, and
    a plurality of charge storage elements, each charge storage element located adjacent to a respective one of the plurality of semiconductor channels.

* * * * *